US012785622B2

(12) United States Patent
Hock et al.

(10) Patent No.: US 12,785,622 B2
(45) Date of Patent: Nov. 3, 2026

(54) SYSTEM AND METHOD FOR MIXING RADIOFREQUENCY SIGNALS

(71) Applicant: KYOCERA AVX Components Corporation, Fountain Inn, SC (US)

(72) Inventors: Joseph M. Hock, Surfside Beach, SC (US); Jeffrey C. Cain, Greenville, SC (US)

( * ) Notice: Subject to any disclaimer, the term of this patent is extended or adjusted under 35 U.S.C. 154(b) by 151 days.

(21) Appl. No.: 18/777,631

(22) Filed: Jul. 19, 2024

(65) Prior Publication Data

US 2025/0047243 A1 Feb. 6, 2025

Related U.S. Application Data

(63) Continuation of application No. 17/528,232, filed on Nov. 17, 2021, now Pat. No. 12,081,169.

(60) Provisional application No. 63/115,189, filed on Nov. 18, 2020.

(51) Int. Cl.
*H03D 7/00* (2006.01)
*H01G 4/30* (2006.01)

(52) U.S. Cl.
CPC ................ *H03D 7/00* (2013.01); *H01G 4/30* (2013.01)

(58) Field of Classification Search
CPC .. H03D 7/00; H01G 4/30; H01G 4/38; H01G 4/012; H01G 4/40; H01G 4/12
See application file for complete search history.

(56) References Cited

U.S. PATENT DOCUMENTS

| | | | |
|---|---|---|---|
| 5,774,801 A | 6/1998 | Li et al. | |
| 6,479,419 B2 | 11/2002 | Masuda | |
| 6,753,070 B2 | 6/2004 | Mori et al. | |
| 6,808,642 B2 | 10/2004 | Takaya et al. | |
| 7,027,795 B2 | 4/2006 | Ji | |
| 7,054,136 B2 | 5/2006 | Ritter et al. | |
| 7,110,740 B2 | 9/2006 | Miyashita | |
| 7,428,137 B2 | 9/2008 | Dowgiallo, Jr. | |
| 8,076,257 B1 * | 12/2011 | Wilson | C04B 35/462 501/139 |
| 8,902,565 B2 | 12/2014 | McConnell et al. | |

(Continued)

FOREIGN PATENT DOCUMENTS

KR 20000039862 A 7/2000

OTHER PUBLICATIONS

Article—LTCC Launches Miniature, Wideband, Low-Cost Mixers from Microwaves & RF Magazine, Mini-Circuits, Jun. 2006, 4 pages.

(Continued)

*Primary Examiner* — Michael P Mcfadden
(74) *Attorney, Agent, or Firm* — Dority & Manning, P.A.

(57) ABSTRACT

A multilayer ceramic radiofrequency mixer can include a first termination, a second termination, a third termination, and a fourth termination. A plurality of interleaved electrodes may include a first set of electrodes connected with the first termination, a second set of electrodes connected with the second termination, a third set of electrodes connected with the third termination, and a fourth set of electrodes connected with the fourth termination. A plurality of dielectric layers may be disposed between respective electrodes of the pluralities of interleaved electrodes. A dielectric constant of the plurality of dielectric layers may vary less than 10% in response to a DC bias voltage applied to the plurality of interleaved electrodes.

19 Claims, 18 Drawing Sheets

(56) References Cited

U.S. PATENT DOCUMENTS

| | | | | |
|---|---|---|---|---|
| 9,240,281 | B2 | 1/2016 | Park et al. | |
| 10,431,388 | B2 | 10/2019 | Ritter et al. | |
| 10,903,016 | B2 | 1/2021 | Ritter et al. | |
| 2002/0030573 | A1 * | 3/2002 | Mori | H01B 3/12<br>501/77 |
| 2002/0137622 | A1 | 9/2002 | Tokita et al. | |
| 2005/0017811 | A1 * | 1/2005 | Asamura | H03B 5/32<br>331/108 C |
| 2008/0158773 | A1 * | 7/2008 | Lee | H01G 4/30<br>361/306.3 |
| 2009/0059469 | A1 * | 3/2009 | Lee | H05K 1/0231<br>361/313 |
| 2013/0155574 | A1 * | 6/2013 | Park | H01G 4/232<br>361/321.3 |
| 2014/0311787 | A1 * | 10/2014 | Park | H01G 4/232<br>361/321.1 |
| 2015/0116892 | A1 * | 4/2015 | Park | H05K 1/0231<br>361/275.3 |
| 2015/0131194 | A1 * | 5/2015 | Park | H01G 4/40<br>361/275.3 |
| 2019/0103228 | A1 * | 4/2019 | Nies | H01G 7/06 |

OTHER PUBLICATIONS

Article—Hi-Rel Components for Space Applications from Mini-Circuits, Jun. 8, 2017, 17 pages.

Product Information—Frequency Mixers from Mini-Circuits, 2006, 4 pages.

International Search Report and Written Opinion for PCT/US2021/059617 dated Mar. 29, 2022, 12 pages.

* cited by examiner

SYSTEM AND METHOD FOR MIXING RADIOFREQUENCY SIGNALS

CROSS REFERENCE TO RELATED APPLICATION

The present application is a continuation of U.S. application Ser. No. 17/528,232, filed on Nov. 17, 2021, which claims filing benefit of U.S. Provisional Patent Application Ser. No. 63/115,189 having a filing date of Nov. 18, 2020, which are incorporated herein by reference in their entirety.

BACKGROUND OF THE INVENTION

Radiofrequency mixing components are typically expensive to manufacture. For example, conventional mixing components often include expensive materials, such as silicon, and/or require expensive manufacturing techniques.

SUMMARY OF THE INVENTION

One example embodiment of the present disclosure is directed to a multilayer ceramic radiofrequency mixer. The multilayer ceramic radiofrequency mixer can include a first termination, a second termination, a third termination, and a fourth termination. A plurality of interleaved electrodes may include a first set of electrodes connected with the first termination, a second set of electrodes connected with the second termination, a third set of electrodes connected with the third termination, and a fourth set of electrodes connected with the fourth termination. A plurality of dielectric layers may be disposed between respective electrodes of the pluralities of interleaved electrodes. A dielectric constant of the plurality of dielectric layers may vary less than 10% in response to a DC bias voltage applied to the plurality of interleaved electrodes.

Another example embodiment of the present disclosure is directed to a radiofrequency mixer system. The radiofrequency mixer system can include a multilayer ceramic component including a first termination, a second termination, a third termination, and a fourth termination. The multilayer ceramic component can include a plurality of interleaved electrodes. The plurality of interleaved electrodes can include a first set of electrodes connected with the first termination, a second set of electrodes connected with the second termination, a third set of electrodes connected with the third termination, and a fourth set of electrodes connected with the fourth termination. The multilayer ceramic component can include a plurality of dielectric layers disposed between respective electrodes of the pluralities of interleaved electrodes. The radiofrequency mixer system can include a first signal source configured to apply a first signal to the first termination with respect to the second termination of the multilayer ceramic component and a second signal source configured to apply a second signal to the third termination of the multilayer ceramic component. The multilayer ceramic component can be configured to output a mixed signal at the fourth termination based on the first signal and the second signal.

Another example embodiment of the present disclosure is directed to a method for mixing signals. The method can include applying a first signal to a first termination of a multilayer ceramic component with respect to a second termination of the multilayer ceramic component. The multilayer ceramic component can include a first termination, a second termination, a third termination, and a fourth termination. The multilayer ceramic component can include a plurality of interleaved electrodes. The plurality of interleaved electrodes can include a first set of electrodes connected with the first termination, a second set of electrodes connected with the second termination, a third set of electrodes connected with the third termination, and a fourth set of electrodes connected with the fourth termination. The multilayer ceramic component can include a plurality of dielectric layers disposed between respective electrodes of the pluralities of interleaved electrodes. The method can include applying a second signal to the third termination of the multilayer ceramic component and receiving a mixed signal at the fourth termination of the multilayer ceramic component based on the first signal and the second signal.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended Figures in which.

Figure 1:
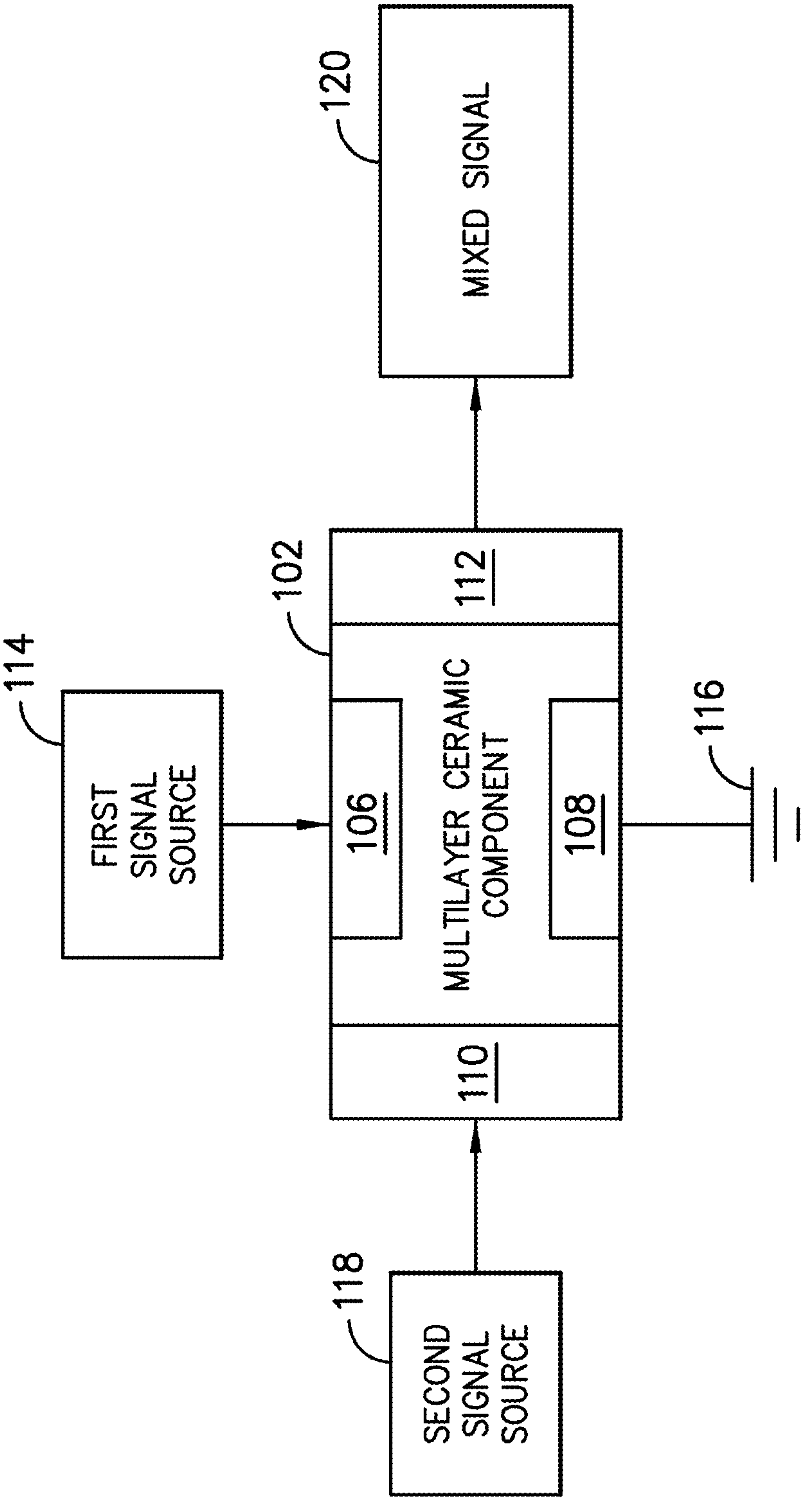
FIG. 1 illustrates an embodiment of a system for mixing signals, such as radiofrequency signals, using a multilayer ceramic component according to aspects of the present disclosure.

Repeat use of reference characters throughout the present specification and appended drawings is intended to represent same or analogous features, elements, or steps thereof.

DETAILED DESCRIPTION OF THE INVENTION

It is to be understood by one of ordinary skill in the art that the present discussion is a description of exemplary embodiments only, and is not intended as limiting the broader aspects of the present invention, which broader aspects are embodied in the exemplary construction.

Generally speaking, the present disclosure is directed to a multilayer ceramic radiofrequency mixer. Processes used to manufacture multilayer ceramic components are more cost effective than those typically used to manufacture conventional radiofrequency mixer components. The present inventors have discovered that selective arrangement and configuration of electrodes of a multilayer ceramic component can be used to provide a low-cost and effective device and system for mixing radiofrequency signals. The multilayer ceramic component can be configured to mix radiofrequency signals from multiple signal sources. For example, the multilayer ceramic component can be surface mounted to a printed circuit board or the like, in connection with multiple signal sources.

According to aspects of the present disclosure, a multilayer ceramic radiofrequency mixer can include a first termination, a second termination, a third termination, and a fourth termination. A plurality of interleaved electrodes may include a first set of electrodes connected with the first termination, a second set of electrodes connected with the second termination, a third set of electrodes connected with the third termination, and a fourth set of electrodes connected with the fourth termination. A plurality of dielectric layers may be disposed between respective electrodes of the pluralities of interleaved electrodes. Generally, a non-tunable dielectric material may be employed. More specifically, a dielectric constant of the plurality of dielectric layers may vary less than 10% in response to a DC bias voltage applied to the plurality of interleaved electrodes. A variety of suitable dielectric materials are described below.

A first signal source can be configured to apply a first signal to the first termination with respect to the second termination of the multilayer ceramic component. For example, the first signal source can be connected with the first termination, and the second termination can be connected with a ground. A second signal source can be configured to apply a second signal to the third termination of the multilayer ceramic component. The multilayer ceramic component can be configured to output a mixed signal at the fourth termination based on the first signal and the second signal.

In general, the dielectric layers can be made of any non-tunable dielectric material generally employed in the art. For instance, the dielectric layer can be made of a ceramic material including a titanate as a primary component. The titanate may include but is not limited to, barium titanate ($BaTiO_3$). The ceramic material may also contain an oxide of a rare-earth metal and/or a compound of such acceptor type element as Mn, V, Cr, Mo, Fe, Ni, Cu, Co, or the like. The titanate may also contain MgO, CaO, $Mn_3O_4$, $Y_2O_3$, $V_2O_5$, ZnO, $ZrO_2$, $Nb_2O_5$, $Cr_2O_3$, $Fe_2O_3$, $P_2O_5$, SrO, $Na_2O$, $K_2O$, $Li_2O$, $SiO_2$, $WO_3$ or the like. The ceramic material may also include other additives, organic solvents, plasticizers, binders, dispersing agents, or the like in addition to ceramic powder.

Additionally, in some embodiments, non-organic dielectric materials may be used including a ceramic, semiconductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor is usually a copper foil which is chemically etched to provide the patterns. In still further embodiments, dielectric material may comprise a material having a relatively high dielectric constant (K), such as one of NPO (COG), X7R, X5R X7S, Z5U, Y5V and strontium titanate. In one example, the dielectric material may have a dielectric constant within a range from between about 2000 and about 4000. The dielectric material may be selected to achieve one or desired mixing characteristics or system properties such as voltage rating, power rating, or the like.

Generally, the dielectric layers exhibit a static dielectric constant when a DC bias voltage is applied. The dielectric layer can be free of tunable dielectric materials. Example tunable dielectric material are described below. Thus, according to aspects of the present disclosure, the dielectric layers of the multilayer ceramic component can generally be free of the below materials, dopants, additives and the like. Similarly, a dielectric constant of the dielectric layers of the multilayer ceramic component can generally exhibit an unchanged or static dielectric constant when a DC bias voltage is applied between two sets of electrodes, unlike tunable dielectric materials.

More particularly, tunable dielectric materials exhibit a variable dielectric constant upon the application of an applied voltage. More particularly, such materials typically have a "voltage tunability coefficient" within the range of from about 10% to about 90%, in some embodiments from about 20% to about 80%, and in some embodiments, from about 30% to about 70%, wherein the "voltage tunability coefficient" is determined according to the following general equation:

$$T = 100 \times (\varepsilon_0 - \varepsilon_V)/\varepsilon_0$$

wherein,

T is the voltage tunability coefficient;

$\varepsilon_0$ is the static dielectric constant of the material without an applied voltage; and $\varepsilon_v$ is the variable dielectric constant of the material after application of the applied voltage (DC).

In contrast with such tunable dielectric materials, a dielectric constant of the dielectric layers of the multilayer ceramic component of the present disclosure can generally exhibit an unchanged or static dielectric constant when a DC bias voltage is applied between two sets of electrodes, unlike tunable dielectric materials. For example, a dielectric constant of the dielectric layers of the multilayer ceramic component of the present disclosure can vary less than 10%, in some embodiments less than 5%, in some embodiments less than 3%, and in some embodiments less than 2%, and in some embodiments less than 1%. The DC bias voltage is generally less than a breakdown voltage of the dielectric layers. For example, the DC bias voltage can vary between 5% and 90% of breakdown voltage of the dielectric layers, in some embodiments between 10% and 80%, and in some embodiments from about 20% and 60%. For example, the DC bias voltage can range from 0.5 volts to 100 volts, in some embodiments from about 1 volt to about 80 volts, in some embodiments from 3 volts to about 60 volts. In one example embodiment, the dielectric constant of the dielectric layers of the multilayer ceramic component of the present disclosure can vary less than 10% when a DC bias voltage of 10 volts is applied (e.g., using an 1806 KEITHLEY 2400 series Source Measure Unit (SMU), for example, a Keithley 2410-C SMU). The dielectric constant can be determined at a frequency of 1 MHz (applied between the active electrodes) in accordance with IEC 60250.

In some embodiments, the dielectric layers of the multilayer ceramic component of the present disclosure can be free of tunable dielectric materials. Example tunable dielectric materials can include dielectrics whose base composition includes one or more ferroelectric base phases, such as perovskites, tungsten bronze materials (e.g., barium sodium niobate), layered structure materials (e.g., bismuth titanate). Example perovskites may include, for instance, barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. Another example tunable dielectric material includes barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other electronically tunable dielectric materials may be used partially or entirely in place of barium strontium titanate. For instance, one example is $Ba_xCa_{1-x}TiO_3$, wherein x is from about 0.2 to about 0.8, and in some embodiments, from about 0.4 to about 0.6. Other suitable pervoskites may include $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5$ $KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). Another example tunable dielectric material may be formed by combining two end-member compositions in alternating layers. Such end-member compositions may be chemically similar but differ in the ratios of A-site dopants as discussed above. For example, composition 1 may be a perovskite compound of the general formula $(A1_x, A2_{(1-x)})BO_3$ and composition 2 may be a perovskite of the general formula $(A1_y, A2_{(1-y)})BO_3$, where A1 and A2 are from Ba, Sr, Mg, and Ca; the potential B-site members are Zr, Ti and Sn, and "x" and "y" denote the mole fraction of each component. A specific example for compound 1 may be $(Ba_{0.8}Sr_{0.2})TiO_3$ and compound 2 may be $(Ba_{0.6}Sr_{0.4})TiO_3$. These two compounds may be combined in alternating layers in a sintered multilayer capacitor with tunable electrode structures such that the dielectric properties of each material are superimposed. The pervoskite material may also be doped with rare earth oxides ("REO"), such as in an amount less than or equal to 5.0 mole percent, and more preferably from 0.1 to 1 mole percent. Example rare earth oxide dopants for this purpose may include, for instance, scandium, yttrium, lanthanum, cerium, praseodymium, neodymium, promethium, samarium, europium, gadolinium, terbium, dysprosium, holmium, erbium, thulium, ytterbium, and lutetium. Thus, in some embodiments, the dielectric layers of the multilayer ceramic component can generally be free of the below materials, dopants, additives, and the like.

In alternative embodiments, however, one or more of the dielectric layers of the multilayer ceramic component can include a tunable dielectric material, such as one or more tunable dielectric material described above. Such tunable dielectric materials may provide adjustable tuning ratios between the input signals in response to a DC voltage applied between two different sets of electrodes.

The dielectric layers may have thicknesses ranging from about 0.5 micrometer (μm) to about 50 μm, in some embodiments from about 1 μm to about 40 μm, and in some embodiments from about 2 μm to about 15 μm. The electrode layers may have thicknesses ranging from about 0.5 μm to about 3.0 μm, in some embodiments from about 1 μm to about 2.5 μm, and in some embodiments from about 1 μm to about 2 μm, e.g., about 1.5 μm. The thickness of the dielectric layers may be selected to achieve one or desired mixing characteristics or system properties such as voltage rating, power rating, or the like.

The plurality of interleaved electrodes can be interleaved in a repeating stacked pattern of four electrodes. The repeating stacked pattern can include one electrode from the first set of electrodes followed by one electrode from the second set of electrodes, followed by one electrode from the third set of electrodes, and one electrode from the fourth set of electrodes. Thus, the electrodes can be stacked in an alternate fashion. However, it should be understood that the electrodes can be stacked in a variety of patterns or configurations within the scope of this disclosure.

A ratio of electrodes associated with the first signal source (e.g., the first set of electrodes and the second set of electrodes) to the electrodes associated with the second signal source (e.g., the third set of electrodes) can be selected to provide a desired mixture or weighted combination of the first and second signals at the further termination. For example, the plurality of interleaved electrodes can include more electrodes form the first set of electrodes than the third set of electrodes to generate a weighted mixed signal that corresponds more strongly with the first signal than the second signal. In such an example, a ratio of a number of electrodes from the first set of electrodes to a number of electrodes from the third set of electrodes can be greater than 1, in some embodiments greater than 2, in some embodiments greater than 3, in some embodiments greater than 5, and in some embodiments greater than 10. As another example, the plurality of interleaved electrodes can include more electrodes form the third set of electrodes than the first set of electrodes to generate a weighted mixed signal that corresponds more strongly with the second signal than the first signal. In such an example, a ratio of a number of electrodes from the first set of electrodes to a number of electrodes from the third set of electrodes can be less than 1, in some embodiments less than 0.5, in some embodiments less than 0.3, in some embodiments less than 0.25, and in some embodiments less than 0.1.

Further variations are possible within the scope of this disclosure. It should be understood that the plurality of interleaved electrodes can be interleaved in a variety of other suitable configurations within the scope of the present disclosure.

In other variations, the multilayer ceramic component can include more than four sets of electrodes and associated terminations. As such the multilayer ceramic component can be configured to mix signals from more than four signal sources. For instance, in some embodiments the multilayer ceramic component can include 5 or more sets of electrodes, in some embodiments 7 or more sets of electrodes, and in some embodiments 10 or more sets or electrodes. Conversely, in some embodiments, the multilayer ceramic component can include only three sets of electrodes. In such an embodiment, the multilayer ceramic component can have only three terminations. Two of the terminations can be coupled with respective signal sources, and a third termination can be configured to output a mixed signal. In such embodiments, the multilayer ceramic component can be considered ungrounded.

The total number of electrode layers may vary. For example, in some embodiments, the total number of electrode layers may range from 2 to about 1,000, in some embodiments from about 10 to about 500, and in some embodiments from about 10 to about 100. It should be understood that the numbers of electrode layers depicted in the Figures and described herein are illustrative only.

The multilayer ceramic component may occupy a small volume and/or surface area of a surface to which it mounted. Thus, the multilayer ceramic component may be well suited for installation on a printed circuit board, for example. The length of the individual multilayer ceramic component may, for instance, range from about 1 mm to about 50 mm, in some embodiments from about 2 mm to about 35 mm, in some embodiments from about 3 mm to about 10 mm, in some embodiments from about 3 mm to about 7 mm. The width of the individual multilayer ceramic component may, for instance, range from about 1 mm to about 50 mm, in some embodiments from about 2 mm to about 35 mm, in some embodiments from about 3 mm to about 10 mm, in some embodiments from about 3 mm to about 7 mm.

Similarly, the multilayer ceramic component may have a low profile suitable for installation on a printed circuit board, for example. The thickness of the individual multilayer ceramic component may, for instance, range from about 1 mm to about 50 mm, in some embodiments from about 2 mm to about 35 mm, in some embodiments from about 3 mm to about 10 mm, in some embodiments from about 2 mm to about 4 mm.

The radiofrequency mixer system for mixing signals can be configured to mix a variety of signals. For example, the system can be configured to mix signals including frequencies ranging from about 500 Hz to about 100 MHz, or higher. In some embodiments, the first signal and/or second signal can include frequencies ranging from about 1 kHz to about 70 MHz, in some embodiments from about 10 kHz to about 60 MHz, in some embodiments from about 100 kHz to about 50 MHz in some embodiments from about 1 MHz to about 40 Mhz.

I. Example Embodiments of the System and Controller

FIG. 1 illustrates an embodiment of a system 100 for mixing signals, such as radiofrequency signals, using a multilayer ceramic component 102 according to aspects of the present disclosure. The multilayer ceramic component 102 may include a first termination 106, a second termination 108, a third termination 110, and a fourth termination 112. The multilayer ceramic component 102 may include a plurality of interleaved electrodes selectively connected with the terminations 106, 108, 110, 112, for example as described below with reference to FIGS. 4A through 5C. The system 100 may include a first signal source 114 configured to apply a first signal to the first termination 106 with respect to the second termination 108 of the multilayer ceramic component 102. For example, the first signal source 114 may be connected with the first termination 106, and the second termination 108 may be connected with a ground 116. A second signal source 118 can be configured to apply a second signal to the third termination 110 of the multilayer ceramic component 102. The multilayer ceramic component 102 can be configured to output a mixed signal 120 at the fourth termination 112 based on the first signal from the first signal source 114 and the second signal from the second signal source 118. The mixed signal 120 can be or include a combination or mixture of the first signal and the second signal.

Figure 2:
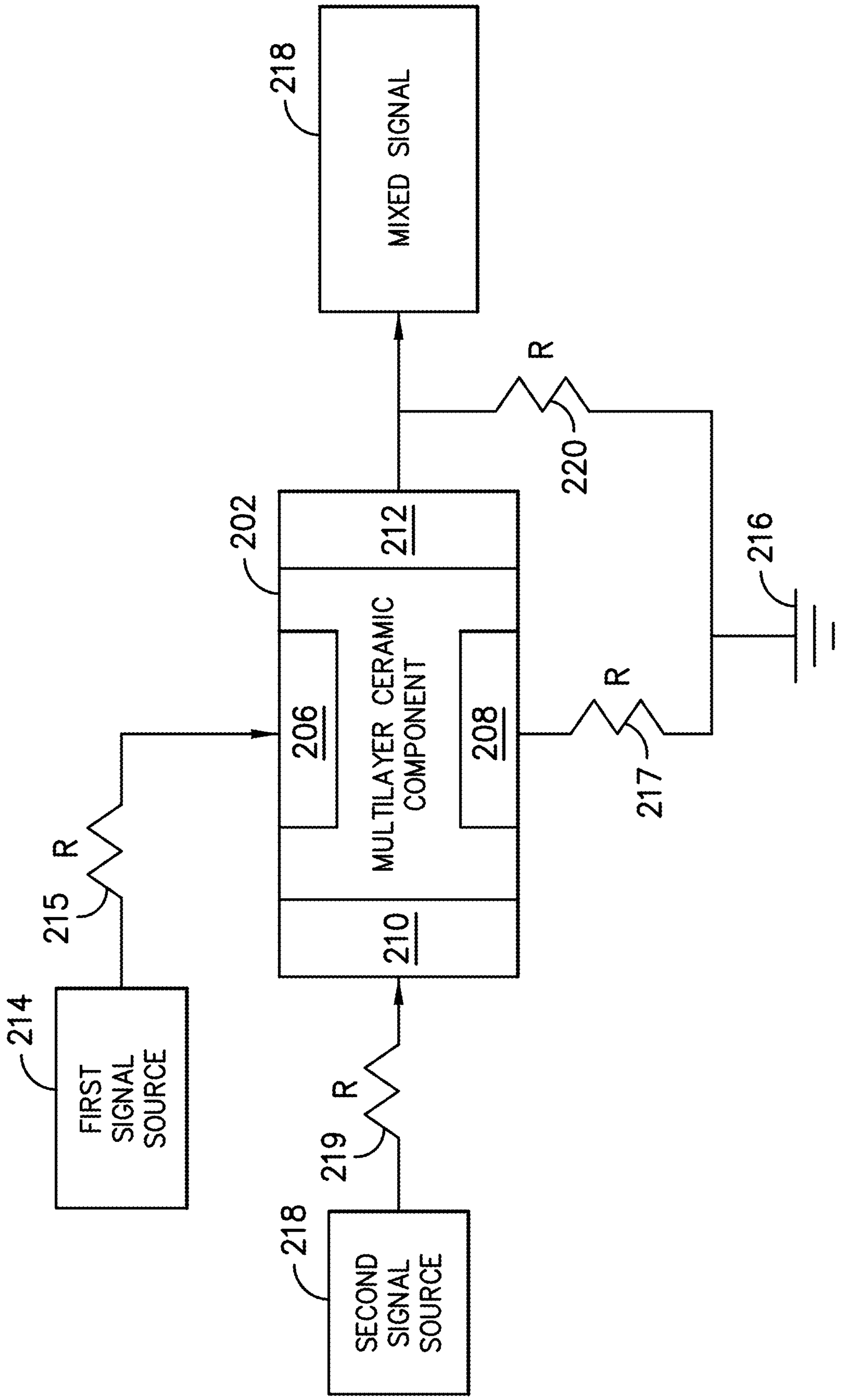
FIG. 2 illustrates an embodiment of a system for mixing signals, such as radiofrequency signals, using a multilayer ceramic component according to aspects of the present disclosure.

FIG. 2 illustrates an embodiment of a system 200 for mixing signals, such as radiofrequency signals, using a multilayer ceramic component 202 according to aspects of the present disclosure. The system 200 can include one or more impedance matching resistors, R. The multilayer ceramic component 202 may include a plurality of interleaved electrodes selectively connected with a plurality of terminations, for example as described below with reference to FIGS. 4A through 5C. The system 200 may include a first signal source 214 configured to apply a first signal to a first termination 206 with respect to a second termination 208 of the multilayer ceramic component 202. The first signal source 214 may be connected with the first termination 206 via a first resistor 215 (e.g., an impedance matching resistor), and the second termination 208 may be connected with a ground 216 via a second resistor 217 (e.g., an impedance matching resistor). A second signal source 218 can be configured to apply a second signal to the third termination 210 of the multilayer ceramic component 202 via a third resistor 219 (e.g., an impedance matching resistor). In some embodiments, a fourth resistor 220 (e.g., an impedance matching resistor) can be connected between the fourth termination 212 and the ground 216. The multilayer ceramic component 202 can be configured to output a mixed signal 218 at the fourth termination 212 based on the first signal from the first signal source 214 and the second signal from the second signal source 218. The mixed signal 218 can include or correspond with a combination or mixture of the first signal and the second signal. The resistors 215, 217, 219, 220 can have resistance values that are selected to provide the desired impedance matching between the terminations 206, 210 and the terminations 208, 212.

Figure 3:
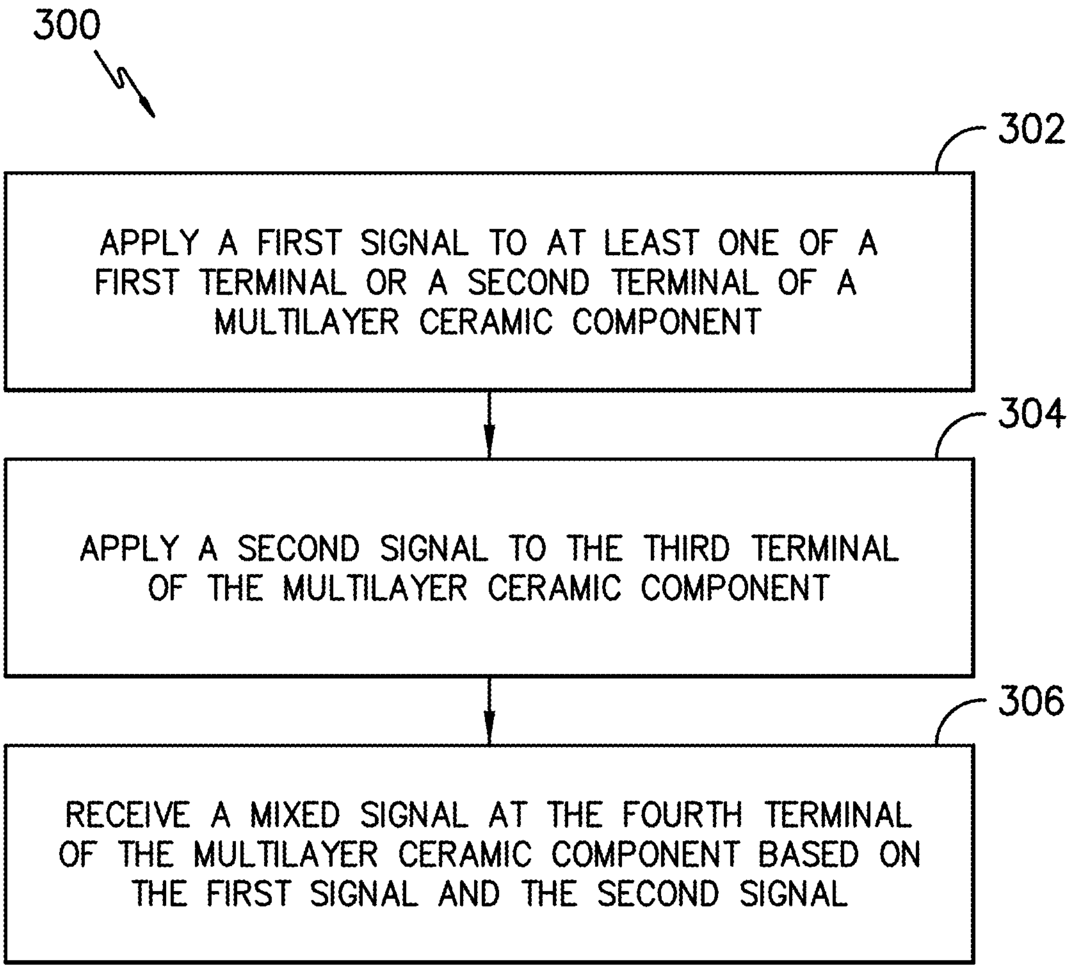
FIG. 3 illustrates a flowchart of a method for mixing signals, such as radiofrequency signals according to aspects of the present disclosure.

FIG. 3 illustrates a flowchart of a method 300 for mixing signals, such as radiofrequency signals according to aspects of the present disclosure. The method 300 for mixing signals can include, at 302, applying a first signal to at least one of a first termination of a multilayer ceramic component or a second termination of the multilayer ceramic component, for example as described herein with reference to FIGS. 1, 2, and 4A through 5C.

The multilayer ceramic component may be configured as described herein with respect to FIGS. 4A-5C. The multilayer ceramic component can include a plurality of interleaved electrodes including a first set of electrodes connected with a first termination, a second set of electrodes connected with a second termination, a third set of electrodes connected with a third termination, and a fourth set of electrodes connected with a fourth termination. A plurality of dielectric layers disposed between respective electrodes of the pluralities of interleaved electrodes.

The method 300, at 304, can include applying a second signal to the third termination of the multilayer ceramic component, for example as described herein with reference to FIGS. 1, 2, and 4A through 5C.

The method 300, at 306, can include receiving a mixed signal at the fourth termination of the multilayer ceramic component based on the first signal and the second signal, for example as described herein with reference to FIGS. 1, 2, and 4A through 5C.

II. Example Embodiments of the Multilayer Ceramic Component

Figure 4A:
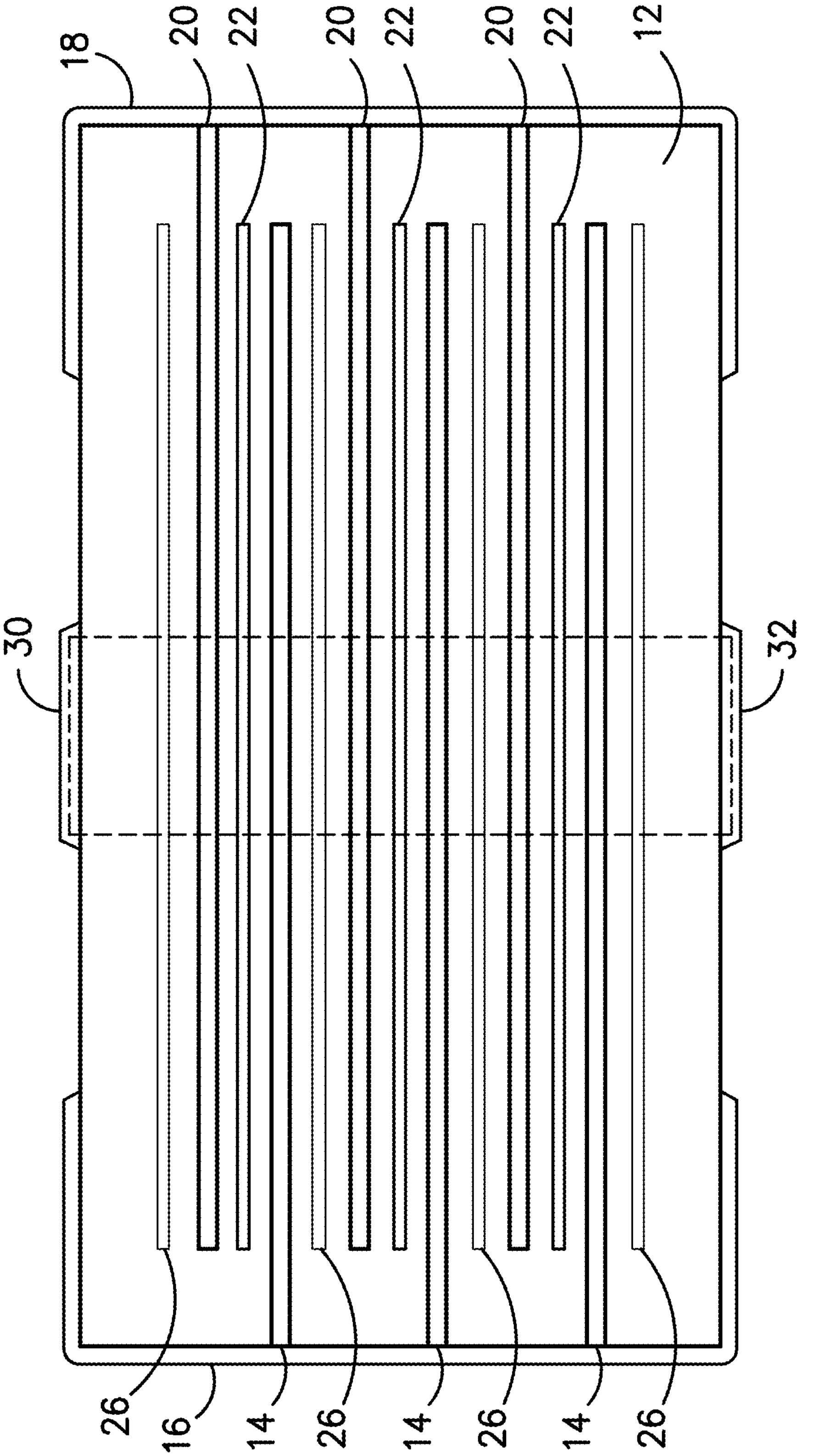
FIG. 4A illustrates a sectional view of an embodiment of a multilayer ceramic component of a radiofrequency mixer system according to aspects of the present disclosure.
Figure 4B:
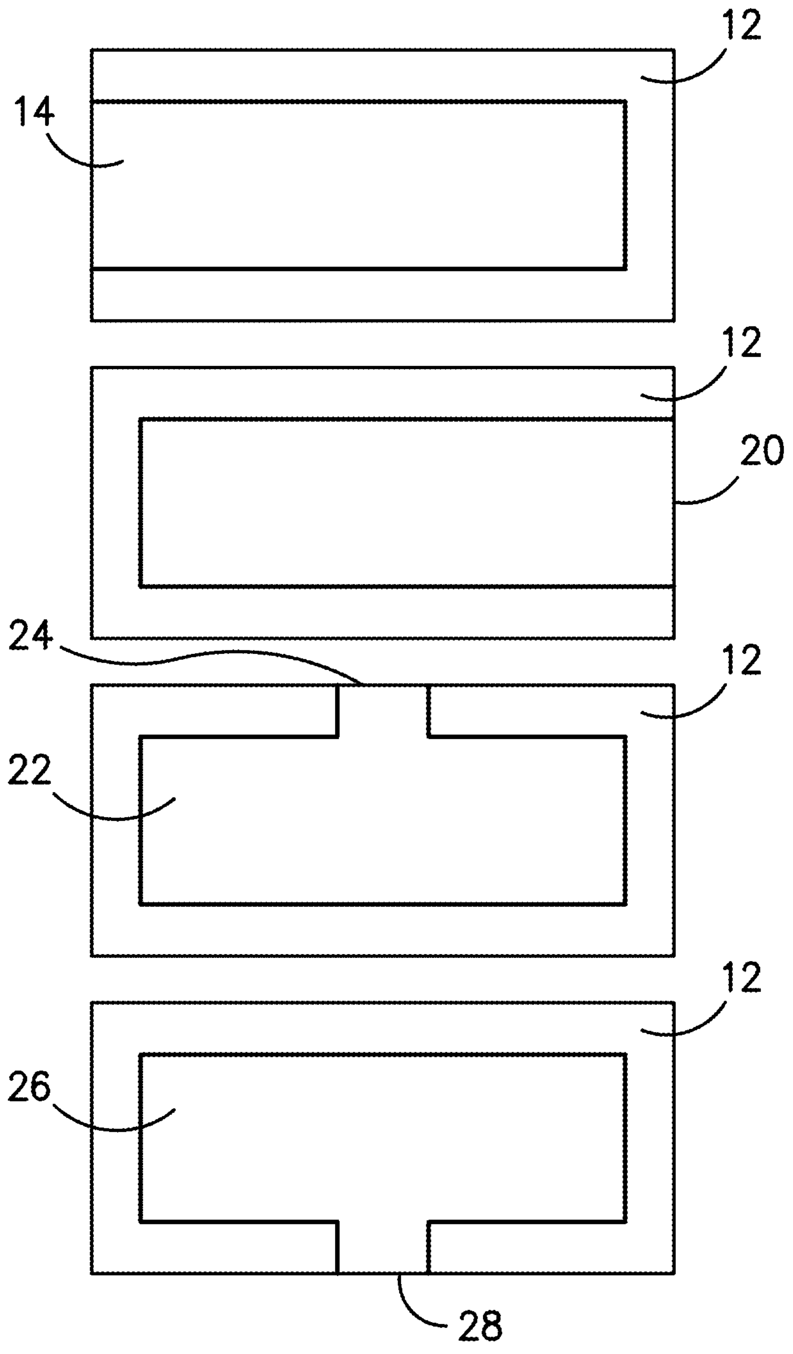
FIG. 4B illustrates an exploded plan view of the multilayer ceramic component of FIG. 4A according to aspects of the present disclosure.
Figure 4C:
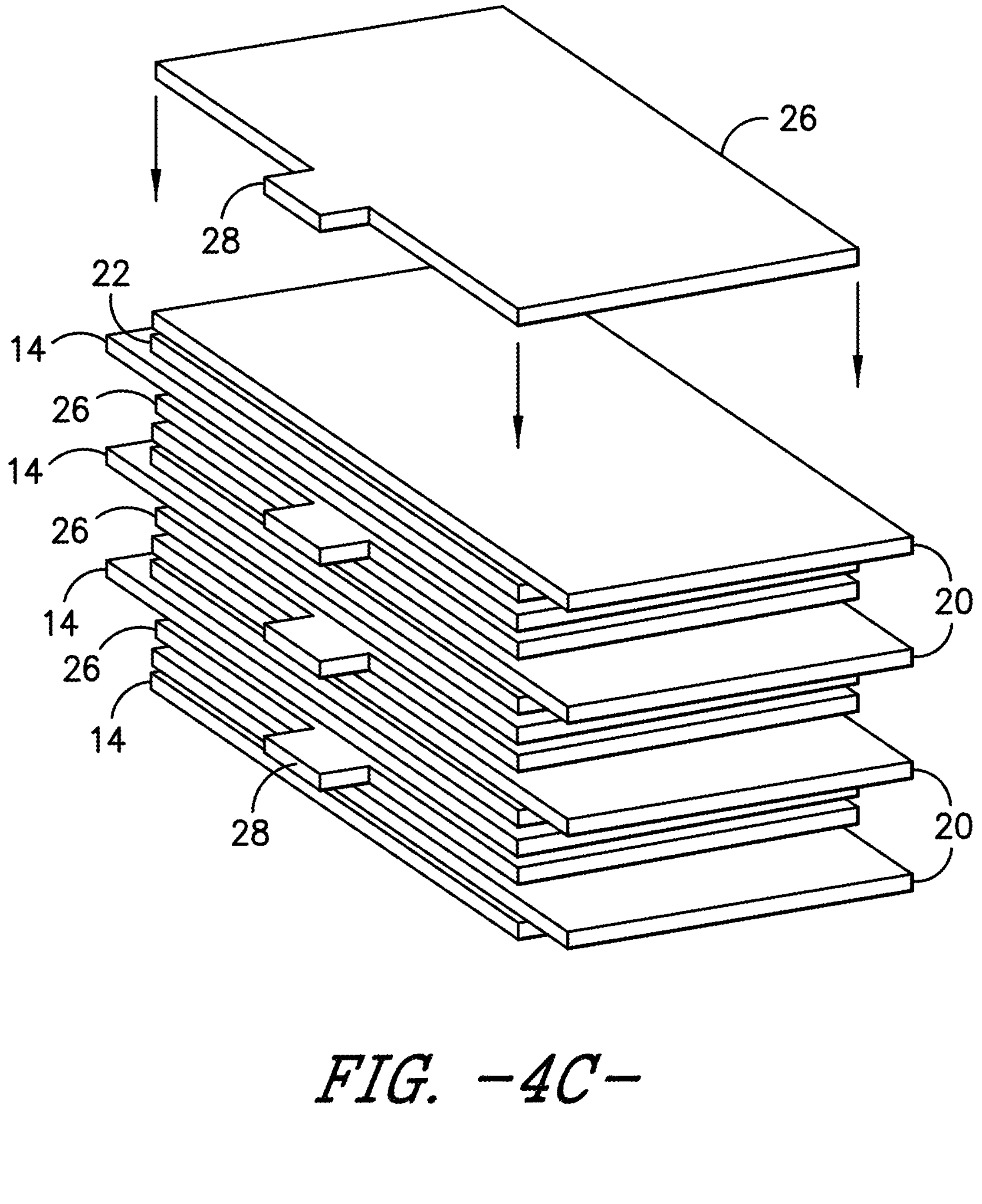
FIG. 4C illustrates an exploded perspective view of the multilayer ceramic component of FIG. 4A according to aspects of the present disclosure.
Figure 4D:
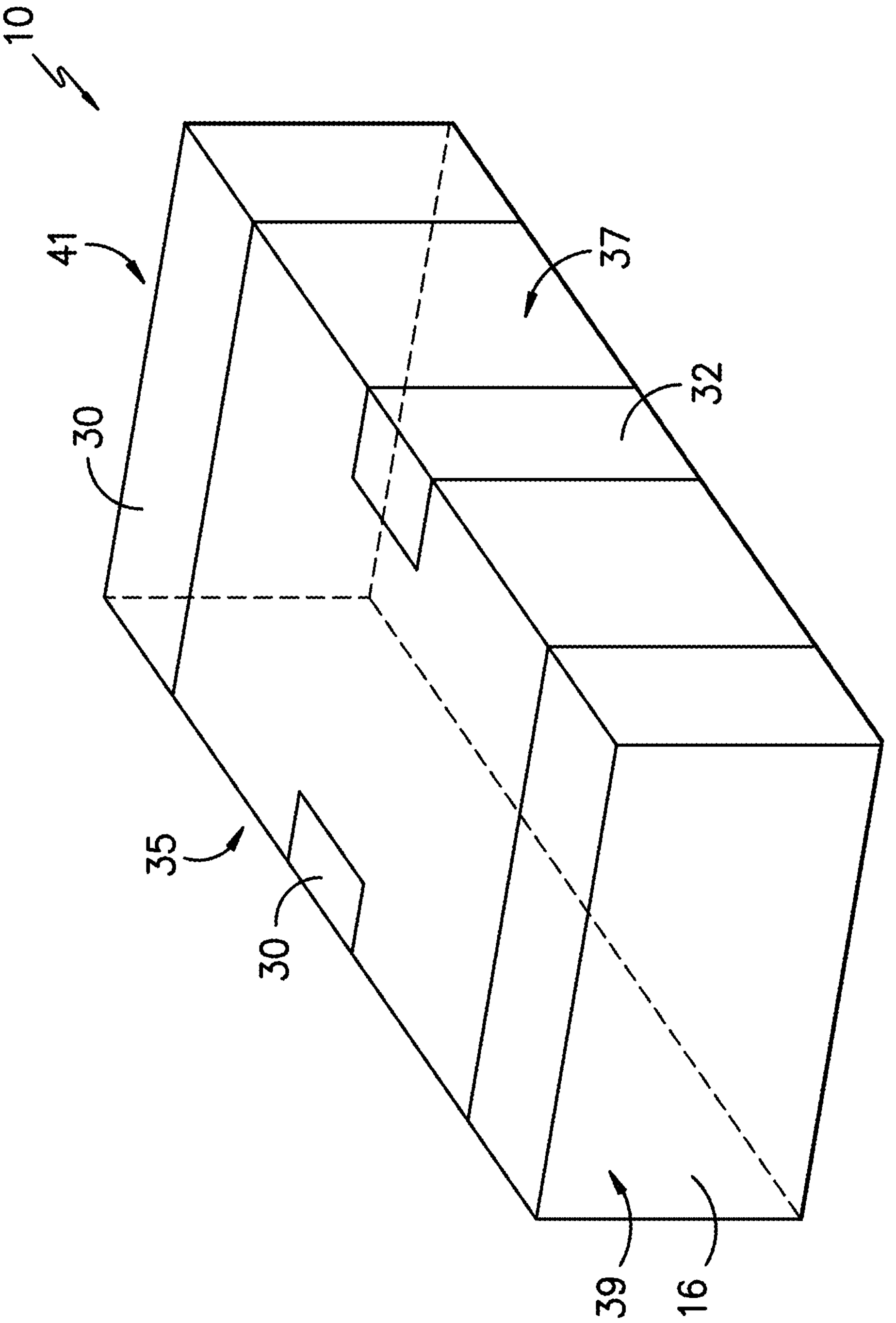
FIG. 4D illustrates a perspective view of the multilayer ceramic component of FIG. 4A according to aspects of the present disclosure.

Referring now to FIGS. 4A through 4D, one particular embodiment of a multilayer ceramic component 10 that can be formed in accordance with the present disclosure will now be described in further detail. FIG. 4D illustrates an exterior of the multilayer ceramic component 10. As shown in FIG. 4D, the multilayer ceramic component 10 can include a first termination 30, a second termination 32, a third termination 16, and a fourth termination 18. The multilayer ceramic component 10 can include a plurality of interleaved electrodes. The plurality of interleaved electrodes can include a first set of electrodes 22 connected with the first termination 30 and a second set of electrodes 26 connected with the second termination 32. The plurality of interleaved electrodes can include a third set of electrodes 14 connected with the third termination 16 and a fourth set of electrodes 20 connected with the fourth termination 18. A plurality of dielectric layers 12 disposed between respective electrodes of the pluralities of interleaved electrodes 14, 20, 22, 26. The plurality of dielectric layers 12 may stacked alternately relative to the electrodes 14, 20, 22, 26.

In some embodiments, the first set of electrodes 22 can include extending members 24 (e.g., tabs) that extend to the side of the multilayer ceramic component 10 and electrically connect with the first termination 30. Similarly, the second set of electrodes 26 can be electrically connected with the second termination 32 via extending members 28 of the second set of electrodes 26. In some embodiments, the third and fourth terminations 16, 18 may wrap around the respective ends of the multilayer ceramic component 10 to provide larger terminations 16, 18 for electrically connecting the multilayer ceramic component 10 in a circuit. For example, the multilayer ceramic component 10 can be coupled to termination of a mounting surface such as a printed circuit board. The first and second terminations 30, 32 may be configured as strips that do not extend the entire sides of the multilayer ceramic component 10. In other embodiments, however, the first and second terminations 30, 32 may instead wrap around the sides of the multilayer ceramic component 10, and the third and fourth terminations 16, 18 may be configured as strips that do not extend the along the entire ends of the multilayer ceramic component.

Referring to FIG. 4A, the plurality of interleaved electrodes can be arranged in a variety of configurations and patterns. For example, at least one electrode from the second set of electrodes 50 and at least one electrode from the third set of electrodes 36 or the fourth set of electrodes 40 can be arranged between one or more pairs of electrodes of the first set of electrodes 22. In some embodiments, at least one electrode from the second set of electrodes 50, at least one electrode from the third set of electrodes 36, and at least one electrode from the fourth set of electrodes 40 can be arranged between one or more pairs of electrodes of the first set of electrodes 22. In some embodiments, the plurality of interleaved electrodes is interleaved in a repeating stacked pattern of four electrodes. The repeating stacked pattern can include one electrode from the first set of electrodes 22 followed by one electrode from the second set of electrodes 50, one electrode from the third set of electrodes 36, and one electrode from the fourth set of electrodes 40. Thus, the electrodes can be stacked in an alternate fashion. However, it should be understood that the electrodes can be stacked in a variety of patterns or configurations within the scope of this disclosure, for example as described below with reference to FIG. 4E.

Referring to FIG. 4D, the multilayer ceramic component 10 can have a generally rectangular prismatic shape. The multilayer ceramic component 10 can include a first side surface 35 and a second side surface 37 that is parallel with the first side surface 35 and opposite to the first side surface 35. The first termination 30 can be disposed on the first side surface 35. The second termination 32 can be disposed on the second side surface 37.

In some embodiments, the multilayer ceramic component 10 can include a third side surface 39 that is perpendicular with the first side surface 35 and second side surface 37. The multilayer ceramic component 10 can include a fourth side surface 41 that is parallel with the third side surface 39 and opposite to the third side surface 39. The third termination 16 can be disposed on the third side surface 39. The fourth termination 30 can be disposed on the fourth side surface 41.

However, it should be understood that the terminations can be arranged in a variety of other configurations within the scope of the present disclosure. For example, the first and second terminations could be disposed on adjacent sides of the multilayer ceramic component. The third and fourth terminations could be disposed on adjacent sides.

It should also be understood that the plurality of interleaved electrodes can be interleaved in a variety of other suitable configurations within the scope of the present disclosure, for example as described below with reference to FIG. 4E. The plurality of interleaved electrodes can include more electrodes form the first set of electrodes than the third set of electrodes to generate a weighted mixed signal that corresponds more strongly with the first signal than the second signal. As another example, the plurality of interleaved electrodes can include more electrodes form the third set of electrodes than the first set of electrodes to generate a weighted mixed signal that corresponds more strongly with the second signal than the first signal. A ratio of electrodes associated with the first signal source (e.g., the first set of electrodes and the second set of electrodes) to the electrodes associated with the second signal source (e.g., the third set of electrodes) can be selected to provide a desired mixture or weighted combination of the first and second signals at the further termination. Further variations are possible within the scope of this disclosure.

Figure 4E:
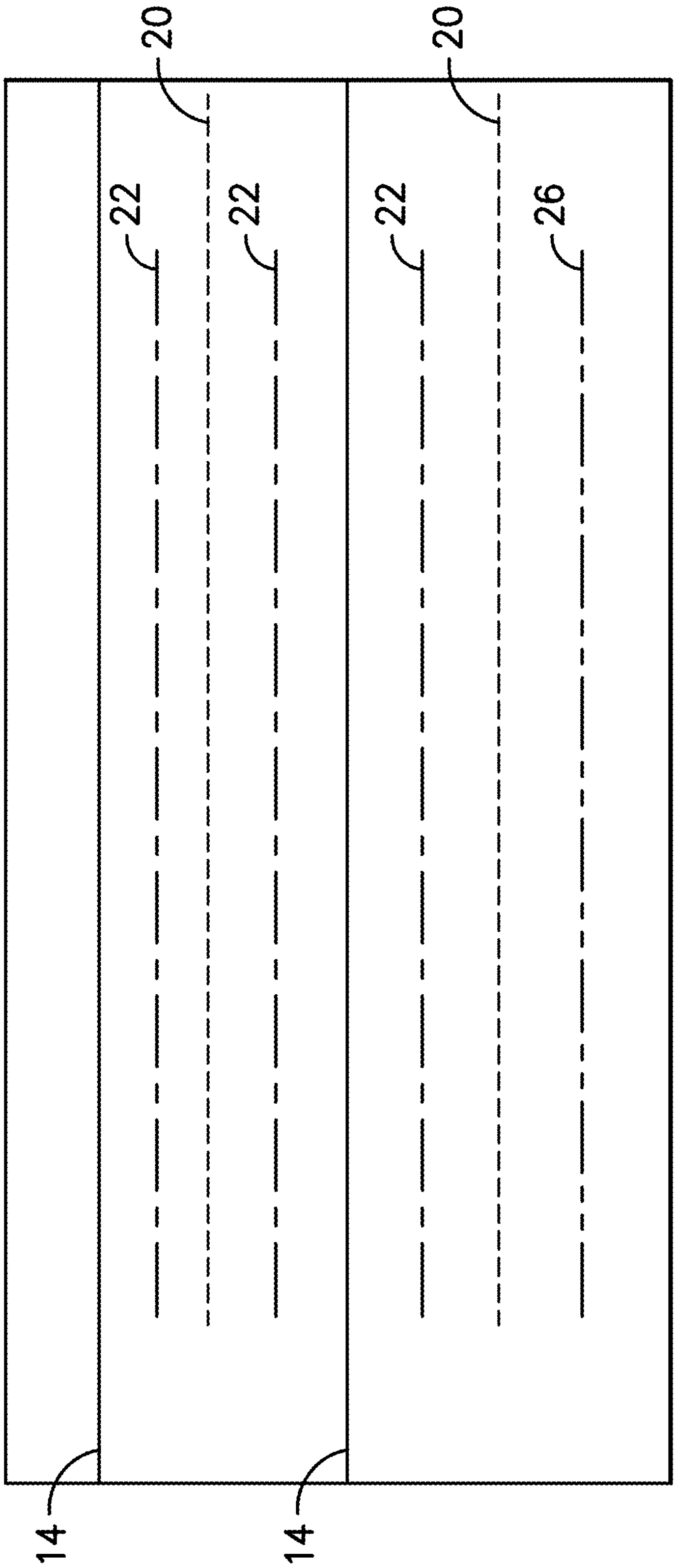
FIG. 4E illustrates a sectional view of an alternative example arrangement of the plurality of interleaved electrodes for a multilayer ceramic component according to aspects of the present disclosure.

FIG. 4E illustrates an alternative example arrangement of the plurality of interleaved electrodes. The plurality of interleaved electrodes can include a repeating pattern that includes more electrodes 22 from the first set of electrodes 22 than electrodes 26 from the second set of electrodes 26. For instance, the repeating pattern can include a series of electrodes including an electrode 14 from the third set of electrodes 14, an electrode 22 from the first set of electrodes 22, an electrode 20 from the second set of electrodes 20, and an electrode 26 from the second set of electrodes 26. As shown, this example repeating pattern includes three electrodes 22 from the first set of electrodes 22 for every two electrodes 14 from the third set of electrodes 14. It should be understood that any suitable ratio can be selected of electrodes from the first set of electrodes 22 and from the third set of electrodes 14 to achieve the desired mixture or weighted combination of the first signal and second signal in the mixed signal.

Figure 5A:
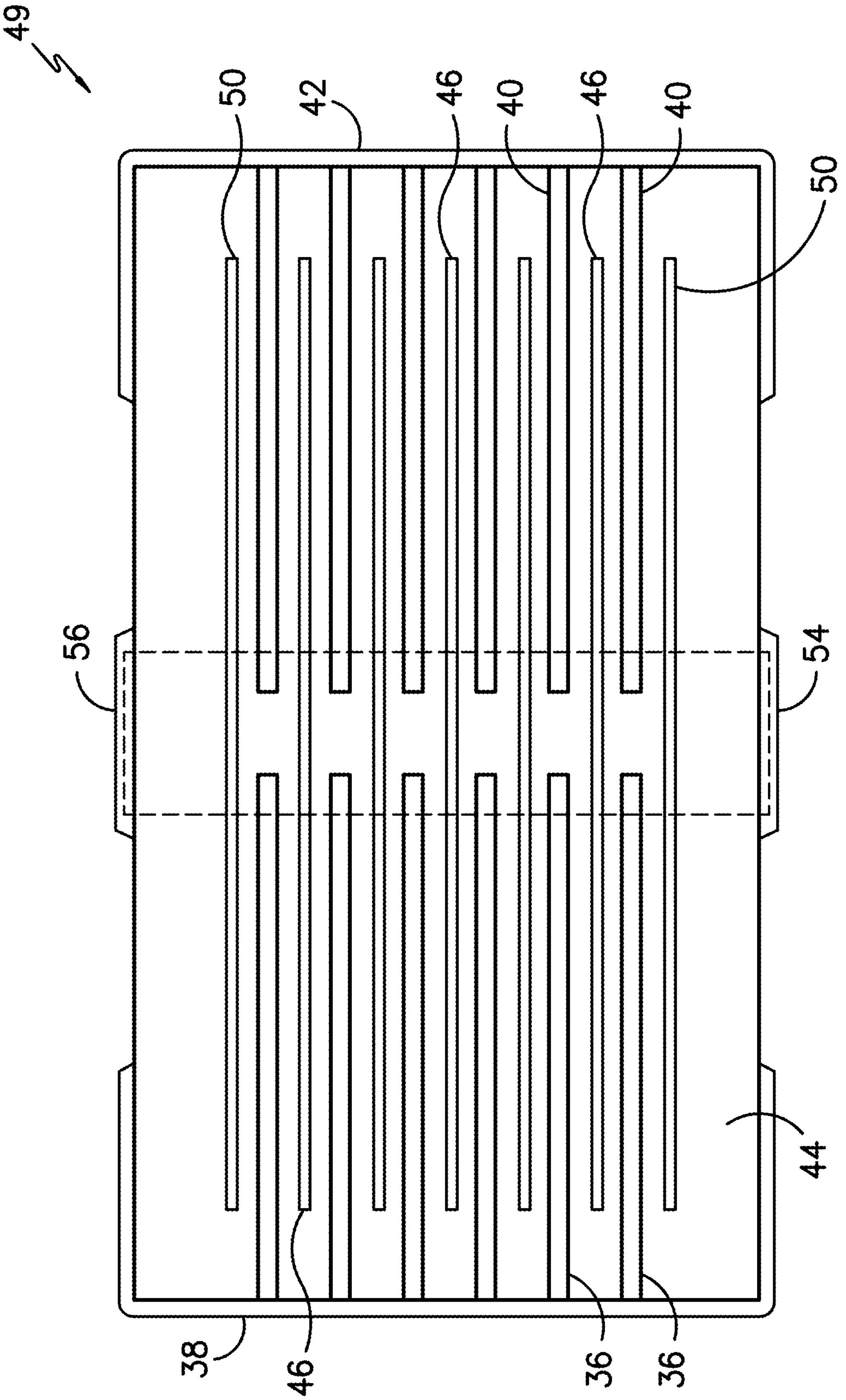
FIG. 5A illustrates a sectional view of another embodiment of a multilayer ceramic component of a radiofrequency mixer system according to aspects of the present disclosure.
Figure 5B:
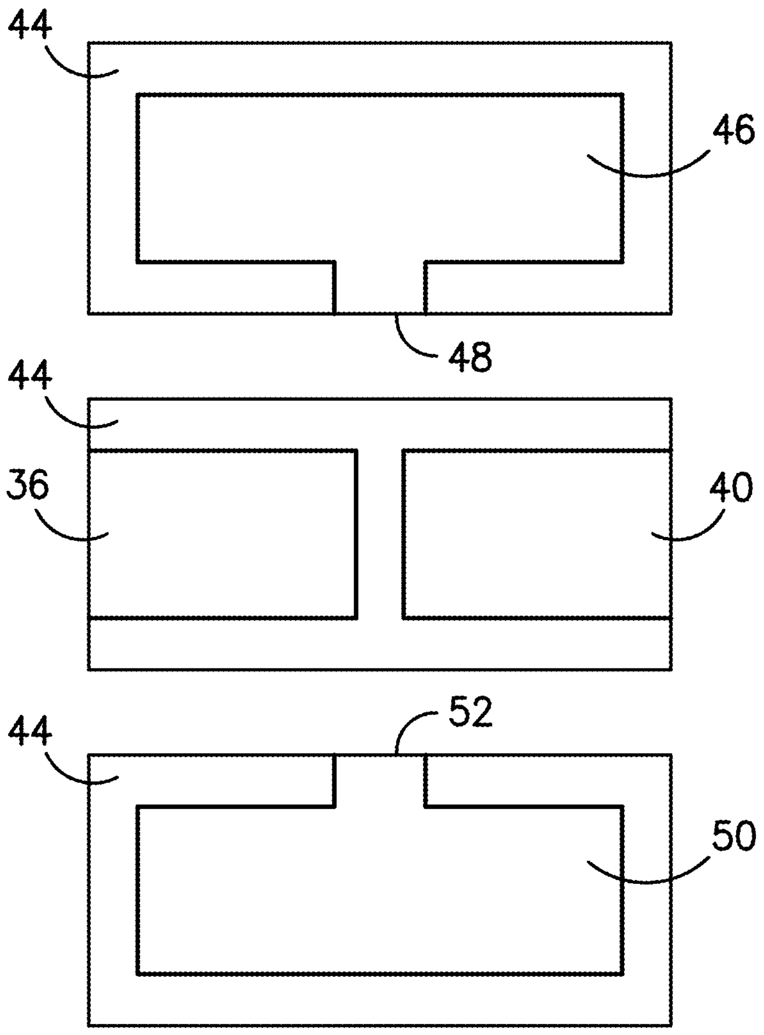
FIG. 5B illustrates an exploded plan view of the multilayer ceramic component of FIG. 5A according to aspects of the present disclosure.
Figure 5C:
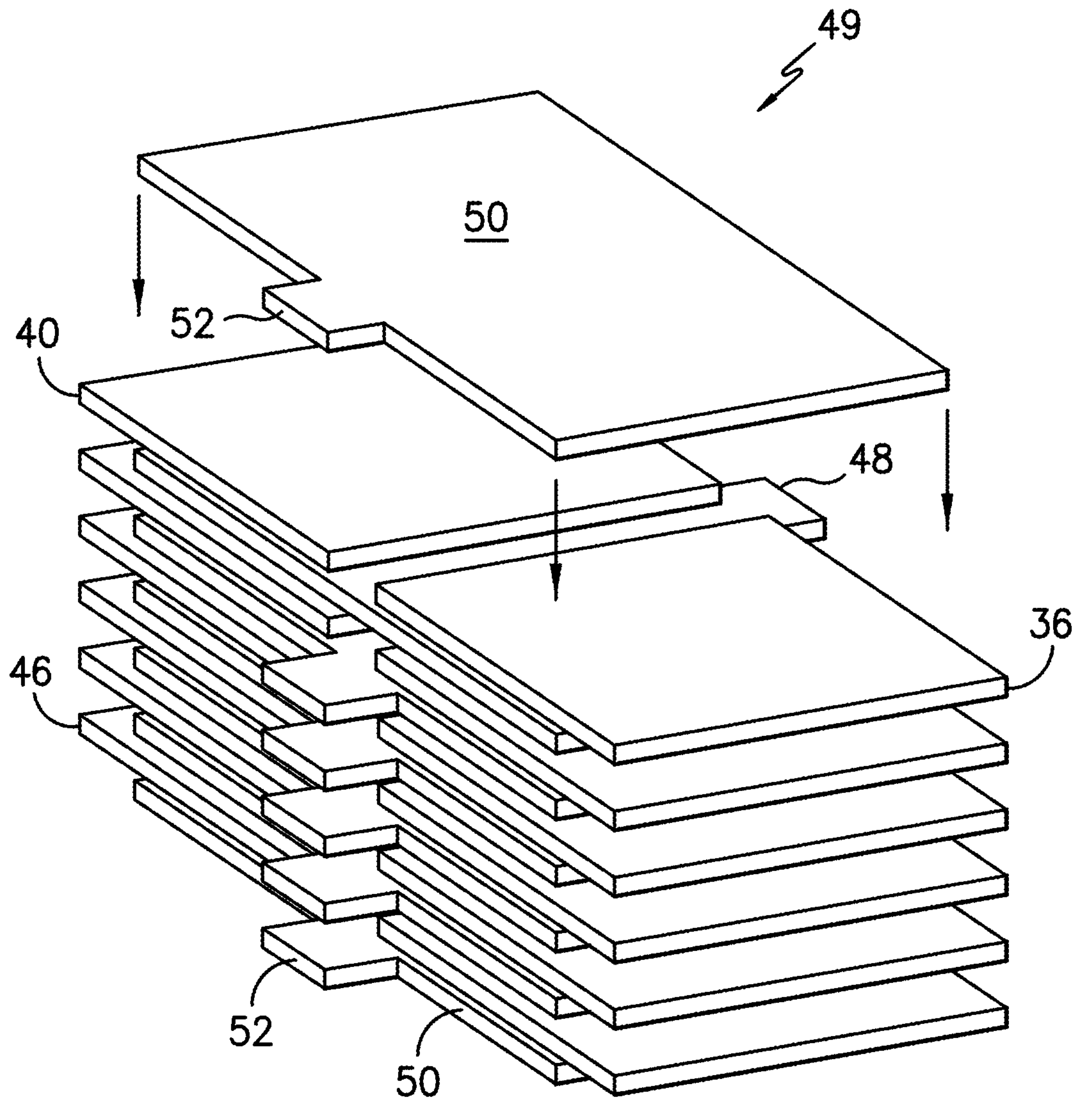
FIG. 5C illustrates an exploded perspective view of the multilayer ceramic component of FIG. 5A according to aspects of the present disclosure.

FIGS. 5A through 5C depict another embodiment of a multilayer ceramic component 49 according to aspects of the present disclosure. The multilayer ceramic component 49 may include a plurality of dielectric layers 44 interleaved with sets electrodes. The multilayer ceramic component 49 may include a first termination 54, a second termination 56, a third termination 38, and a fourth termination 42. The multilayer ceramic component 49 may include a plurality of interleaved electrodes including a first set of electrodes 46 connected with the first termination 54, a second set of electrodes 50 connected with the second termination 56. The plurality of interleaved electrodes can include a third set of electrodes 36 connected with the third termination 38 and a fourth set of electrodes 40 connected with the fourth termination 42. Each electrode of the third set of electrodes 36 can be arranged co-planar with a respective electrode of the fourth set of electrodes 40.

Figure 6:
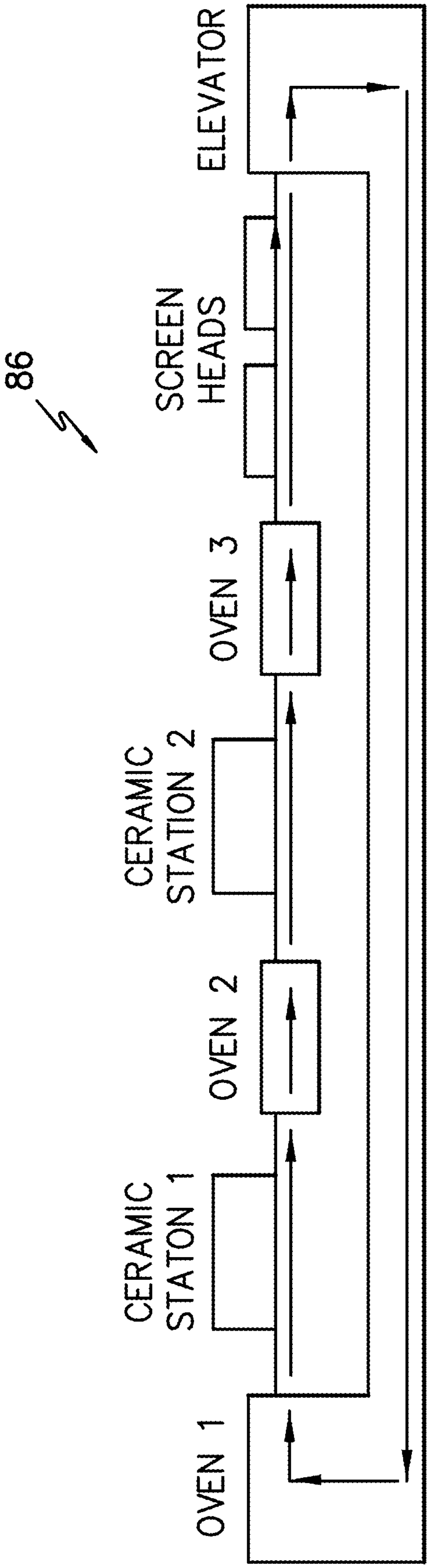
FIG. 6 represents a chip manufacturing automated process (CMAP) usable in manufacturing the multilayer ceramic component of the present disclosure according to aspects of the present disclosure.

The presently disclosed subject matter equally encompasses associated and/or corresponding methodologies for manufacturing multilayer ceramic components for use in systems and methods described herein. For example, FIG. 6 represents a chip manufacturing automated process (CMAP) 86, which is usable in conjunction with manufacturing device exemplary embodiments as disclosed herewith. As shown, the process 86 may include a number of successive stages, involving in some instances three ovens with interceding ceramic stations or other steps/facets such as the use of screen heads or elevator and conveyor features, as representatively shown. Those of ordinary skill in the art will understand that the exact provision of successive steps will depend on which of the exemplary device embodiments disclosed herewith (or modifications thereof) are being produced. Also, the individual steps indicated are only intended as representative of the indicated type of step, and do not denote required use of other aspects beyond the general nature of the steps indicated. For example, the screen head step may involve the use of a stainless steel screen together with an electrode paste for screen pasting of electrode layers, or other technologies for such step may be practiced. For example, more conventional steps of alternate stacking and laminating (with tapes) may be practiced. In either process (or others), those of ordinary skill in the art will recognize that selected steps may be practiced to produce a particular design selected for a given application of the presently disclosed subject matter.

III. Applications

The presently disclosed systems and methods may find application in a variety of systems, devices, and industries. The multilayer ceramic component can mix signals from two or more sources. The system may be used in radiofrequency transmitters, receivers, repeaters, transponders, diplexers, multiplexers, or any other component that could benefit from a compact, low price radiofrequency mixer.

EXAMPLE

A system for mixing signals as described herein was fabricated and tested. A first signal was applied to first termination of the multilayer ceramic component using a local oscillator. A second signal was applied to the third termination using a source signal generator (e.g., using an 1806 KEITHLEY 2400 series Source Measure Unit (SMU), for example, a Keithley 2410-C SMU). The second signal included a sinusoidal signal having a frequency of 20 MHz generated by the source signal generator. A mixed signal was detected at the fourth termination (e.g., using the source signal generator). This was repeated for various signals and configurations of the filter.

FIGS. 7 through 12 illustrate experimental data collected from the system in one experiment. In this experiment, the first signal included a sinusoidal signal having a frequency of 19.9 MHz that was generated by a local oscillator. The second signal included a sinusoidal signal having a frequency of 20 MHz generated using a source signal generator. A mixed signal of the first signal and second signal should exhibit a peak at 100 kHz corresponding with the difference between the respective frequencies of the signals.

Figure 7:
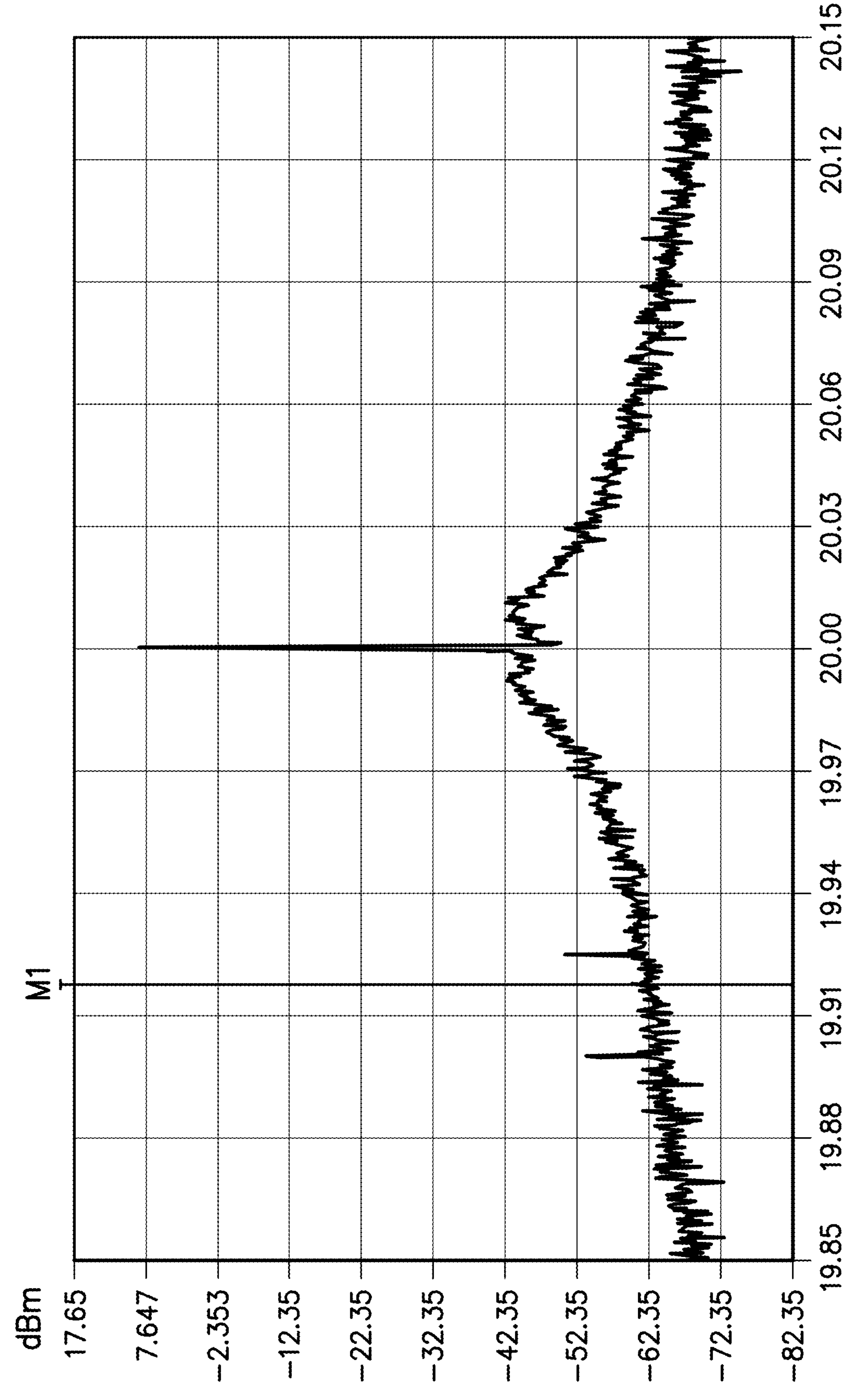
FIG. 7 is a spectrogram of a second signal including a sinusoidal waveform having a frequency of 20 MHz applied to a third termination of a multilayer ceramic component during an experiment.
Figure 8:
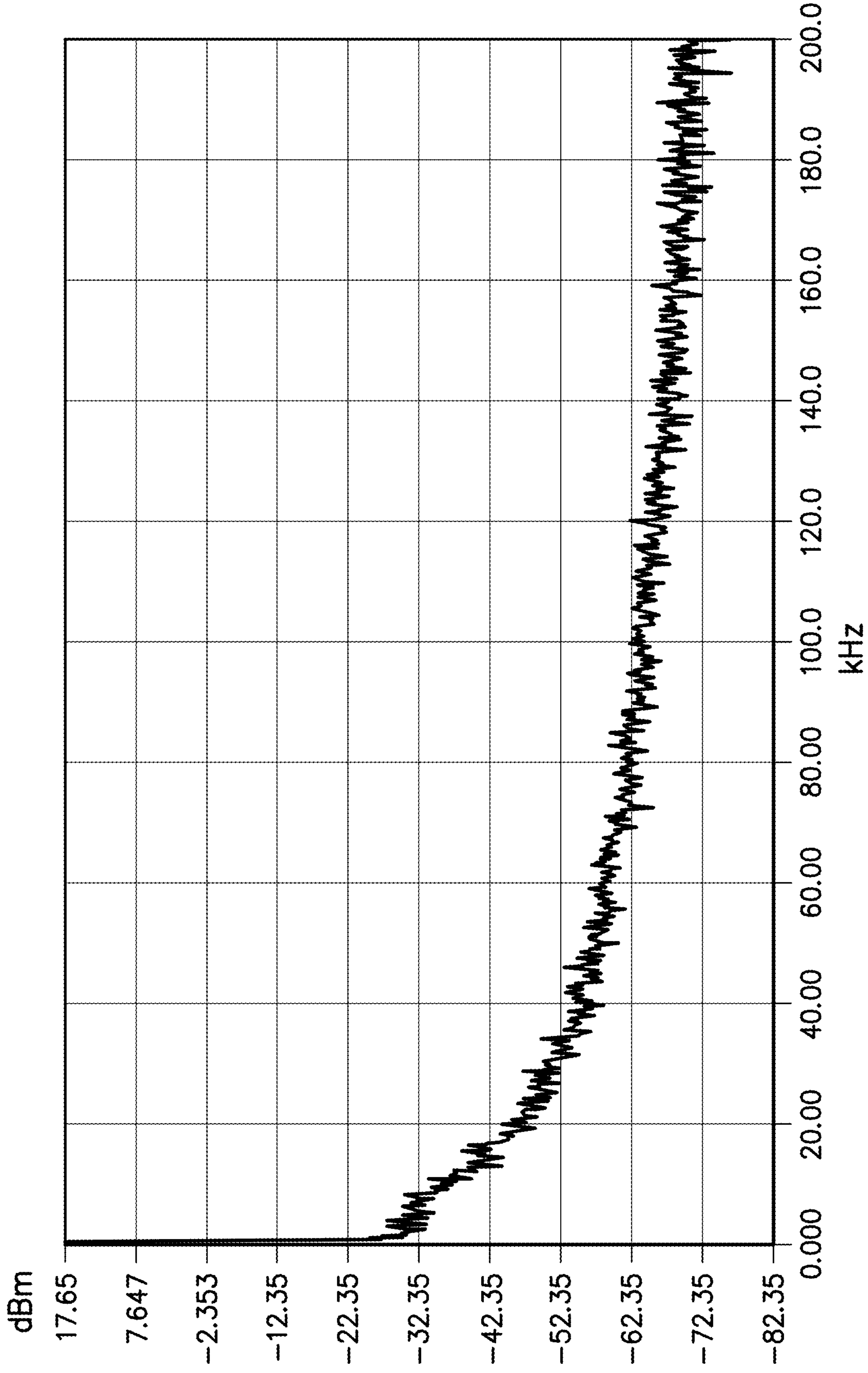
FIG. 8 is a spectrogram of a signal detected at the fourth termination when the second signal of FIG. 7 was applied to the third termination without a signal applied to the first termination.

FIG. 7 is a spectrogram of the second signal including the sinusoidal waveform having a frequency of 20 MHz. The second signal was applied to the third termination of the multilayer ceramic component without a signal being applied to first termination. FIG. 8 illustrates a spectrogram of a signal detected at the fourth termination. The spectrogram ranges from 0 kHz to 200 MHz. As shown in FIG. 8, a peak was not detected at 100 kHz.

Figure 9:
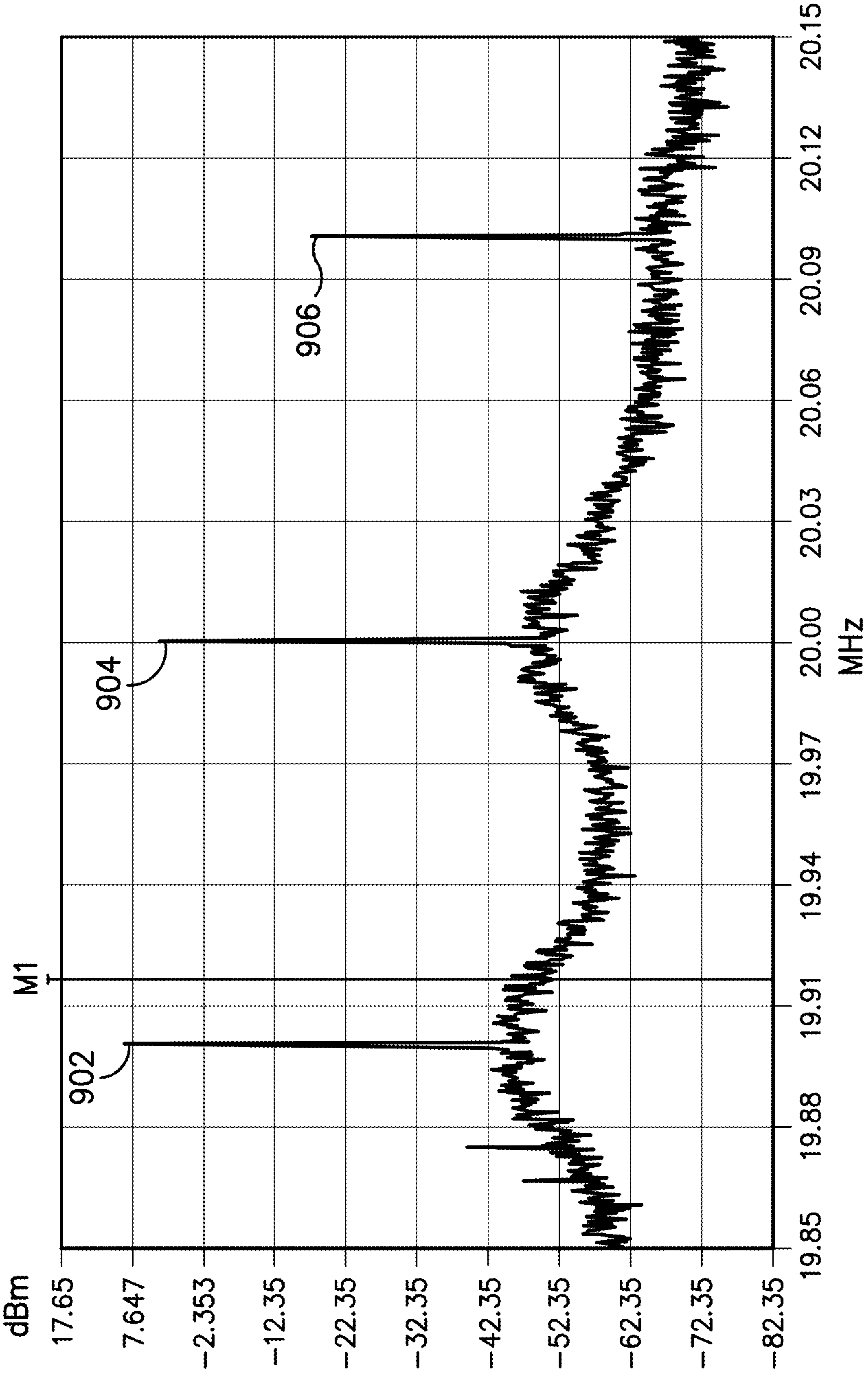
FIG. 9 is a spectrogram of a mixed signal detected at the fourth termination when a first signal of 19.9 MHz was applied to the first termination and the second signal having a frequency of 20 MHz of FIG.7 was applied to the third termination.

Next, the first signal source was connected with the first termination such that the first signal was applied to the first termination. FIG. 9 illustrates a spectrogram ranging from 19.85 MHz to 20.15 MHz of the mixed signal. As shown in FIG. 9, a peak 902 was observed at 19.9 MHz corresponding with the first signal. A peak 904 was observed at 20 MHz corresponding with the second signal. Additionally, a peak 906 was observed at 20.1 MHz as a result of interference between the first signal and second signal.

Figure 10:
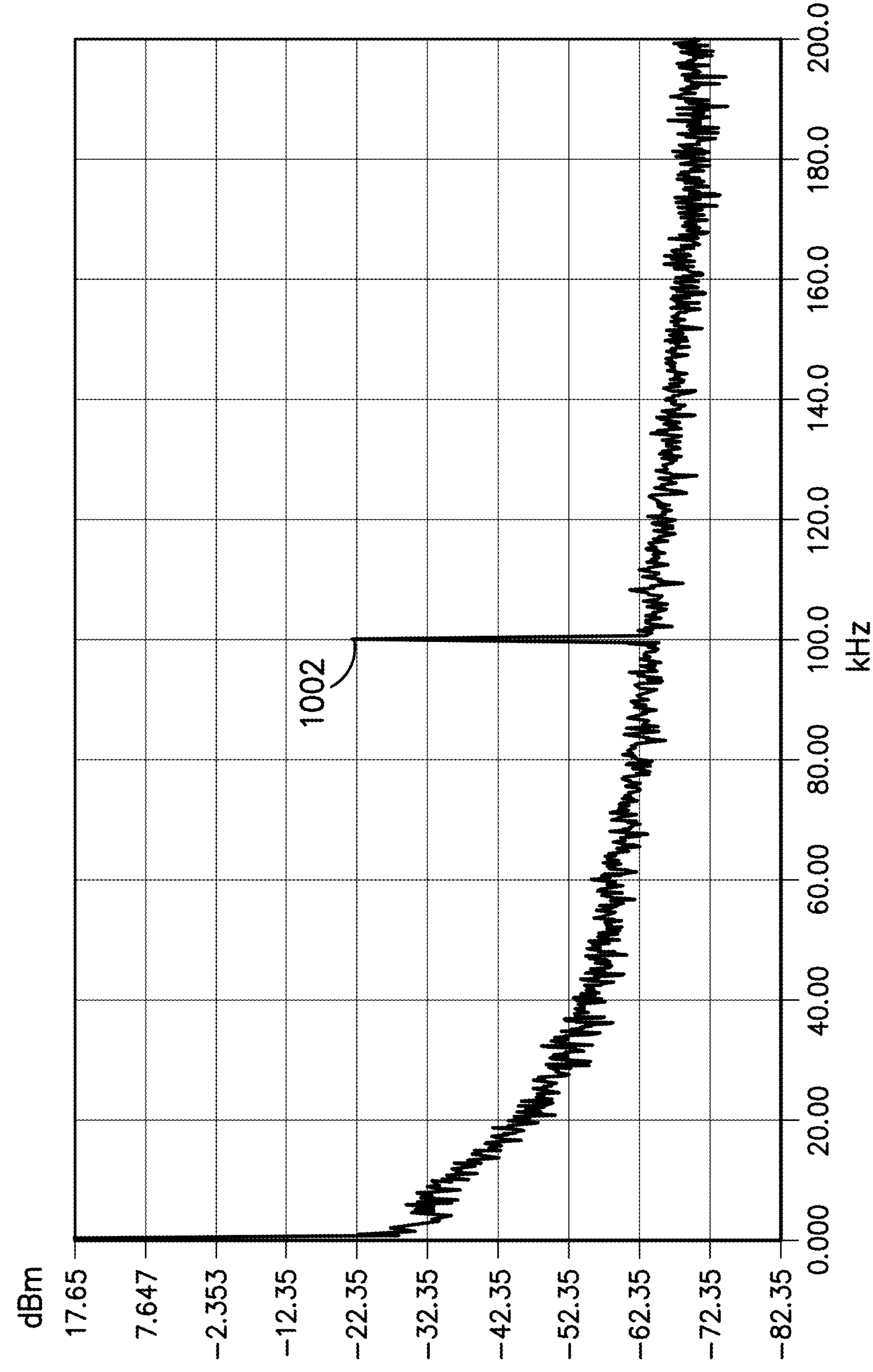
FIG. 10 is a spectrograph of the mixed signal of FIG. 9 with a frequency range of 0 kHz to 200 kHz.

FIG. 10 is a spectrograph of the mixed signal ranging from 0 kHz to 200 kHz. As seen in FIG. 10, a peak 1002 was observed at 100 kHz corresponding to a difference between the 20 MHz frequency of the second signal and the 19.9 MHz frequency of the first signal. Comparison with FIG. 8 illustrates that the multilayer ceramic component has mixed the first signal and second signal when producing the mixed signal at the fourth termination.

Figure 11:
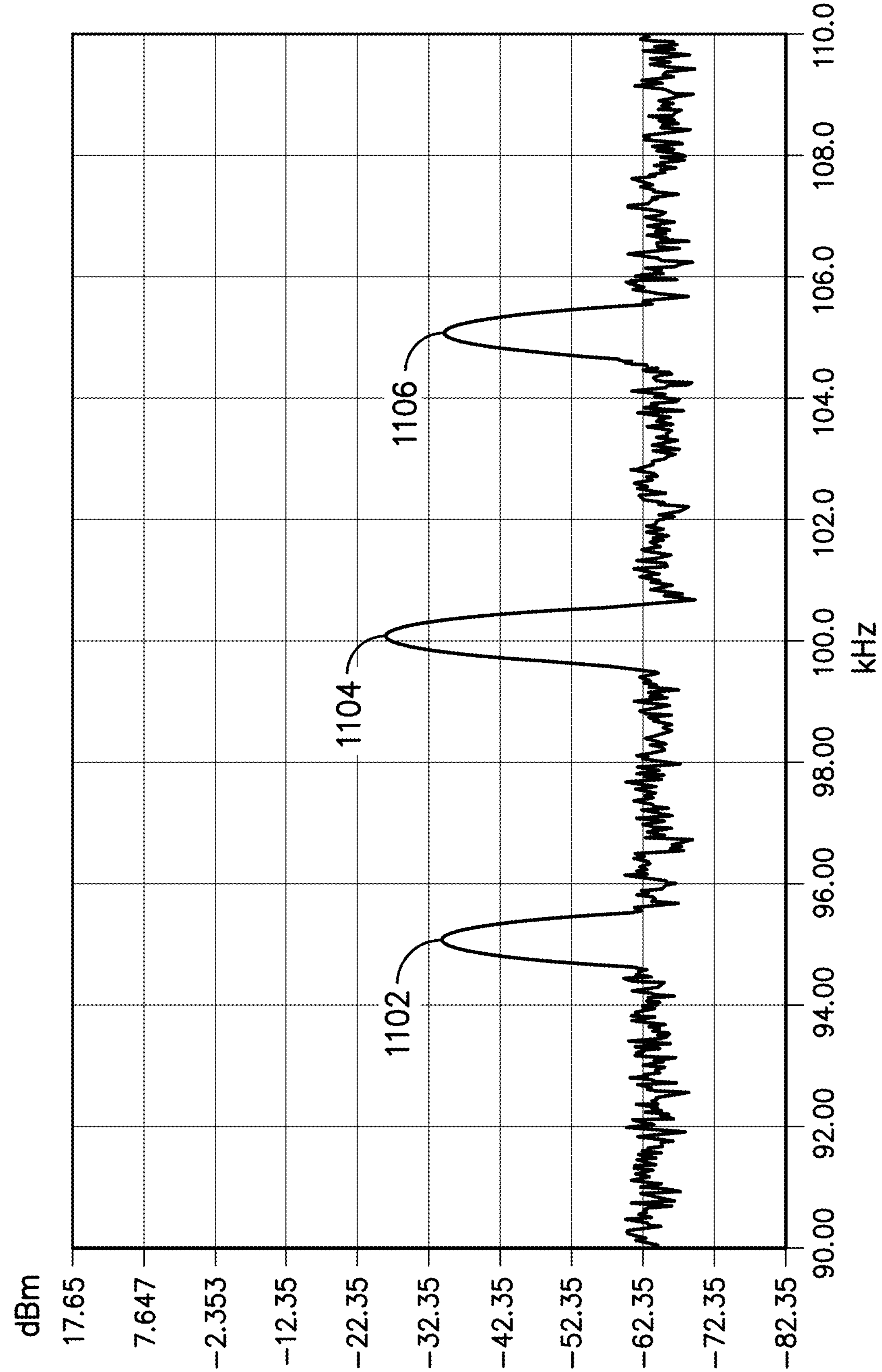
FIG. 11 is a spectrograph of the mixed signal when a 5 kHz signal modulated on the first signal and the second signal.
Figure 12:
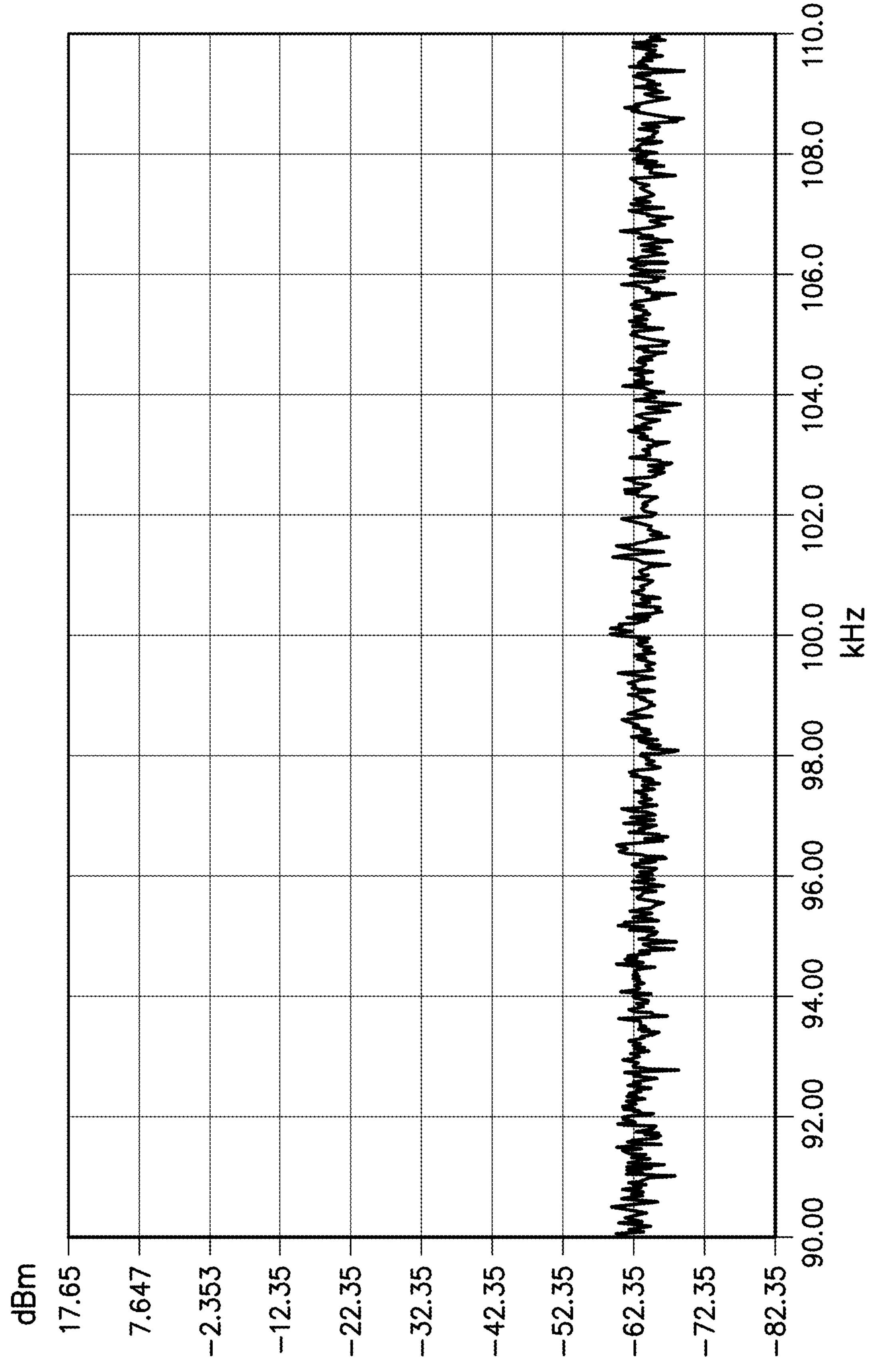
FIG. 12 is a spectrograph of a signal detected at the fourth termination without the first signal source being connected to the multilayer ceramic component.

FIG. 11 is a spectrograph of the mixed signal with a 5 kHz signal modulated on the first signal and the second signal. As shown in FIG. 11, a first peak 1102 at 95 kHz was detected. A second peak 1104 at 100 kHz was detected. A third peak 1106 at 105 kHz was detected. FIG. 12, in contrast, is a spectrograph of a signal detected at the fourth termination without the first signal source being connected to the multilayer ceramic component.

Further aspects of the disclosure are provided by the subject matter of the following clauses:

1. A multilayer ceramic radiofrequency mixer comprising a first termination, a second termination, a third termination, and a fourth termination; a plurality of interleaved electrodes comprising a first set of electrodes connected with the first termination; a second set of electrodes connected with the second termination; a third set of electrodes connected with the third termination; and a fourth set of electrodes connected with the fourth termination; a plurality of dielectric layers disposed between respective electrodes of the pluralities of interleaved electrodes, wherein a dielectric constant of the plurality of dielectric layers varies less than 10% in response to a DC bias voltage applied to the plurality of interleaved electrodes.
2. The multilayer ceramic radiofrequency mixer of any preceding clause, wherein the plurality of dielectric layers is free of a base composition including one or more ferroelectric base phases.
3. The multilayer ceramic radiofrequency mixer of any preceding clause, wherein the plurality of dielectric layers is free of a tunable dielectric material.
4. The multilayer ceramic radiofrequency mixer of any preceding clause, wherein the plurality of dielectric layers comprises a dielectric material that exhibits a dielectric constant of about 10 or less as determined at a frequency of 1 MHz in accordance with IEC 60250.
5. The multilayer ceramic radiofrequency mixer of any preceding clause, wherein the plurality of dielectric layers comprises a dielectric material that exhibits a dielectric loss tangent of about 0.1 or less as determined at a frequency of 1 MHz in accordance with IEC 60250.
6. The multilayer ceramic radiofrequency mixer of any preceding clause, wherein the multilayer ceramic radiofrequency mixer comprises a first side surface and a second side surface that is parallel with the first side surface and opposite to the first side surface, and wherein the first termination is disposed on the first side surface and the second termination is disposed on the second side surface.
7. The multilayer ceramic radiofrequency mixer of any preceding clause, wherein the multilayer ceramic radiofrequency mixer comprises a third side surface that is perpendicular with the first side surface, the multilayer ceramic radiofrequency mixer comprising a fourth side surface that is parallel with the third side surface and opposite to the third side surface, and wherein the third termination is disposed on the third side surface and the fourth termination is disposed on the fourth side surface.
8. The multilayer ceramic radiofrequency mixer of any preceding clause, wherein the first set of electrodes comprises a pair of electrodes, and wherein at least one electrode from the second set of electrodes and at least one electrode from the third set of electrodes or the fourth set of electrodes arranged between the pair of electrodes of the first set of electrodes.
9. The multilayer ceramic radiofrequency mixer of any preceding clause, wherein the first set of electrodes comprises a pair of electrodes, and wherein at least one electrode from the second set of electrodes, at least one electrode from the third set of electrodes, and at least one electrode from the fourth set of electrodes is arranged between the pair of electrodes of the first set of electrodes.
10. The multilayer ceramic radiofrequency mixer of any preceding clause, wherein the plurality of interleaved electrodes are interleaved in a repeating stacked pattern of four electrodes comprising one electrode from each of the first set of electrodes, the second set of electrodes, the third set of electrodes, and the fourth set of electrodes.
11. The multilayer ceramic radiofrequency mixer of any preceding clause, wherein a ratio of a number of electrodes from the first set of electrodes to a number of electrodes from the third set of electrodes is greater than 1.
12. The multilayer ceramic radiofrequency mixer of any preceding clause, wherein a ratio of a number of electrodes from the first set of electrodes to a number of electrodes from the third set of electrodes is less than 1.
13. A radiofrequency mixer system comprising a multilayer ceramic component comprising a first termination, a second termination, a third termination, and a fourth termination; a plurality of interleaved electrodes comprising a first set of electrodes connected with the first termination, a second set of electrodes connected with the second termination, a third set of electrodes connected with the third termination, and a fourth set of electrodes connected with the fourth termination; a plurality of dielectric layers disposed between respective electrodes of the pluralities of interleaved electrodes; a first signal source configured to apply a first signal to the first termination with respect to the second termination of the multilayer ceramic component; and a second signal source configured to apply a second signal to the third termination of the multilayer ceramic component, wherein the multilayer ceramic component is configured to output a mixed signal at the fourth termination based on the first signal and the second signal.
14. The radiofrequency mixer system of any preceding clause, wherein the plurality of dielectric layers comprises a dielectric material that exhibits a dielectric constant of about 10 or less as determined at a frequency of 1 MHz in accordance with IEC 60250.
15. The radiofrequency mixer system of any preceding clause, wherein the plurality of dielectric layers comprises a dielectric material that exhibits a dielectric loss tangent of about 0.1 or less as determined at a frequency of 1 MHz in accordance with IEC 60250.
16. The radiofrequency mixer system of any preceding clause, wherein the plurality of dielectric layers is free of a base composition including one or more ferroelectric base phases.
17. The radiofrequency mixer system of any preceding clause, wherein a dielectric constant of the plurality of dielectric layers varies less than 10% in response to a DC bias voltage applied to the plurality of interleaved electrodes.
18. The radiofrequency mixer system of any preceding clause, wherein the first set of electrodes comprises a pair of electrodes, and wherein at least one electrode from the second set of electrodes and at least one electrode from the third set of electrodes or the fourth set of electrodes arranged between the pair of electrodes of the first set of electrodes.

19. The radiofrequency mixer system of any preceding clause, wherein the first set of electrodes comprises a pair of electrodes, and wherein at least one electrode from the second set of electrodes, at least one electrode from the third set of electrodes, and at least one electrode from the fourth set of electrodes is arranged between the pair of electrodes of the first set of electrodes.

20. The radiofrequency mixer system of any preceding clause, wherein the plurality of interleaved electrodes are interleaved in a repeating stacked pattern of four electrodes comprising one electrode from each of the first set of electrodes, the second set of electrodes, the third set of electrodes, and the fourth set of electrodes.

21. The radiofrequency mixer system of any preceding clause, wherein a ratio of a number of electrodes from the first set of electrodes to a number of electrodes from the third set of electrodes is greater than 1.

22. The radiofrequency mixer system of any preceding clause, wherein a ratio of a number of electrodes from the first set of electrodes to a number of electrodes from the third set of electrodes is less than 1.

23. The radiofrequency mixer system of any preceding clause, wherein at least one of the first signal source or the second signal source comprises a local oscillator.

24. The radiofrequency mixer system of any preceding clause, wherein the first signal source configured to apply the first signal to the first termination, and wherein the second termination of the multilayer ceramic component is grounded.

25. The radiofrequency mixer system of any preceding clause, wherein the plurality of dielectric layers is free of a tunable dielectric material.

26. The radiofrequency mixer system of any preceding clause, wherein the multilayer ceramic component comprises a first side surface and a second side surface that is parallel with the first side surface and opposite to the first side surface, and wherein the first termination is disposed on the first side surface and the second termination is disposed on the second side surface.

27. The radiofrequency mixer system of any preceding clause, wherein the multilayer ceramic component comprises a third side surface that is perpendicular with the first side surface, the multilayer ceramic component comprising a fourth side surface that is parallel with the third side surface and opposite to the third side surface, and wherein the third termination is disposed on the third side surface and the fourth termination is disposed on the fourth side surface.

28. A method for mixing signals comprising applying a first signal to a first termination of a multilayer ceramic component with respect to a second termination of the multilayer ceramic component, the multilayer ceramic component comprising a first termination, a second termination, a third termination, and a fourth termination; a plurality of interleaved electrodes comprising a first set of electrodes connected with the first termination, a second set of electrodes connected with the second termination, a third set of electrodes connected with the third termination, and a fourth set of electrodes connected with the fourth termination; and a plurality of dielectric layers disposed between respective electrodes of the pluralities of interleaved electrodes; applying a second signal to the third termination of the multilayer ceramic component; and receiving a mixed signal at the fourth termination of the multilayer ceramic component based on the first signal and the second signal.

29. The method of any preceding clause, wherein applying the first signal to the first termination of the multilayer ceramic component comprises applying the first signal using a local oscillator.

30. An apparatus comprising one or more aspects of any of the embodiments disclosed herein and/or variants thereof.

31. A system comprising one or more aspects of any of the embodiments disclosed herein and/or variants thereof.

32. A method comprising one or more aspects of any of the embodiments disclosed herein and/or variants thereof.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A multilayer ceramic radiofrequency mixer comprising:

a first termination, a second termination, a third termination, and a fourth termination;

a plurality of interleaved electrodes comprising:

a first set of electrodes connected with the first termination;

a second set of electrodes connected with the second termination;

a third set of electrodes connected with the third termination; and a fourth set of electrodes connected with the fourth termination, wherein each electrode of the third set of electrodes is arranged co-planar with a respective electrode of the fourth set of electrodes, and wherein each electrode of the third set of electrodes is rectangular in shape and each electrode of the fourth set of electrodes is rectangular in shape;

a plurality of dielectric layers disposed between respective electrodes of the pluralities of interleaved electrodes, wherein a dielectric constant of the plurality of dielectric layers varies less than 10% in response to a DC bias voltage applied to the plurality of interleaved electrodes.

2. The multilayer ceramic radiofrequency mixer of claim 1, wherein the plurality of dielectric layers is free of a tunable dielectric material.

3. The multilayer ceramic radiofrequency mixer of claim 1, wherein the plurality of dielectric layers comprises a dielectric material that exhibits a dielectric constant of about 10 or less.

4. The multilayer ceramic radiofrequency mixer of claim 1, wherein the plurality of dielectric layers comprises a dielectric material that exhibits a dielectric loss tangent of about 0.1 or less.

5. The multilayer ceramic radiofrequency mixer of claim 1, wherein the multilayer ceramic radiofrequency mixer comprises a first side surface and a second side surface that is parallel with the first side surface and opposite to the first side surface, and wherein the first termination is disposed on the first side surface and the second termination is disposed on the second side surface.

6. The multilayer ceramic radiofrequency mixer of claim 5, wherein the multilayer ceramic radiofrequency mixer comprises a third side surface that is perpendicular with the first side surface, the multilayer ceramic radiofrequency mixer comprising a fourth side surface that is parallel with the third side surface and opposite to the third side surface, and wherein the third termination is disposed on the third side surface and the fourth termination is disposed on the fourth side surface.

7. The multilayer ceramic radiofrequency mixer of claim 1, wherein the first set of electrodes comprises a pair of electrodes, and wherein at least one electrode from the second set of electrodes and at least one electrode from the third set of electrodes or the fourth set of electrodes arranged between the pair of electrodes of the first set of electrodes.

8. The multilayer ceramic radiofrequency mixer of claim 1, wherein the first set of electrodes comprises a pair of electrodes, and wherein at least one electrode from the second set of electrodes, at least one electrode from the third set of electrodes, and at least one electrode from the fourth set of electrodes is arranged between the pair of electrodes of the first set of electrodes.

9. The multilayer ceramic radiofrequency mixer of claim 1, wherein a ratio of a number of electrodes from the first set of electrodes to a number of electrodes from the third set of electrodes is greater than 1.

10. The multilayer ceramic radiofrequency mixer of claim 1, wherein a ratio of a number of electrodes from the first set of electrodes to a number of electrodes from the third set of electrodes is less than 1.

11. The multilayer ceramic radiofrequency mixer of claim 1, further comprising:
- a first side surface, the first termination disposed on the first side surface;
- a second side surface parallel with the first side surface and opposite to the first side surface, the second termination disposed on the second side surface;
- a third side surface perpendicular with the first side surface and the second side surface, the third termination disposed on the third side surface; and
- a fourth side surface parallel with the third side surface and opposite to the third side surface, the fourth termination disposed on the fourth side surface,
- wherein each electrode of the third set of electrodes extends along the third side surface and is spaced apart from each of the first side surface and the second side surface, and
- wherein each electrode of the fourth set of electrodes extends along the fourth side surface and is spaced apart from each of the first side surface and the second side surface.

12. A radiofrequency mixer system comprising:
- a multilayer ceramic component comprising:
  - a first termination, a second termination, a third termination, and a fourth termination;
  - a plurality of interleaved electrodes comprising:
    - a first set of electrodes connected with the first termination,
    - a second set of electrodes connected with the second termination,
    - a third set of electrodes connected with the third termination, and
    - a fourth set of electrodes connected with the fourth termination, wherein each electrode of the third set of electrodes is arranged co-planar with a respective electrode of the fourth set of electrodes, and wherein each electrode of the third set of electrodes is rectangular in shape and each electrode of the fourth set of electrodes is rectangular in shape; and
  - a plurality of dielectric layers disposed between respective electrodes of the pluralities of interleaved electrodes, wherein a dielectric constant of the plurality of dielectric layers varies less than 10% in response to a DC bias voltage applied to the plurality of interleaved electrodes;
- a first signal source configured to apply a first signal to the first termination with respect to the second termination of the multilayer ceramic component; and
- a second signal source configured to apply a second signal to the third termination of the multilayer ceramic component, wherein the multilayer ceramic component is configured to output a mixed signal at the fourth termination based on the first signal and the second signal.

13. The radiofrequency mixer system of claim 12, wherein the first set of electrodes comprises a pair of electrodes, and wherein at least one electrode from the second set of electrodes and at least one electrode from the third set of electrodes or the fourth set of electrodes arranged between the pair of electrodes of the first set of electrodes.

14. The radiofrequency mixer system of claim 12, wherein the first set of electrodes comprises a pair of electrodes, and wherein at least one electrode from the second set of electrodes, at least one electrode from the third set of electrodes, and at least one electrode from the fourth set of electrodes is arranged between the pair of electrodes of the first set of electrodes.

15. The radiofrequency mixer system of claim 12, wherein a ratio of a number of electrodes from the first set of electrodes to a number of electrodes from the third set of electrodes is greater than 1.

16. The radiofrequency mixer system of claim 12, wherein a ratio of a number of electrodes from the first set of electrodes to a number of electrodes from the third set of electrodes is less than 1.

17. The radiofrequency mixer system of claim 12, wherein at least one of the first signal source or the second signal source comprises a local oscillator.

18. The radiofrequency mixer system of claim 12, wherein the first signal source configured to apply the first signal to the first termination, and wherein the second termination of the multilayer ceramic component is grounded.

19. The radiofrequency mixer system of claim 12, wherein the plurality of dielectric layers is free of a tunable dielectric material.

* * * * *